United States Patent [19]
Limberg

[11] Patent Number: 6,104,763
[45] Date of Patent: Aug. 15, 2000

[54] SYNCHRODYNING OF VSB AND QAM FINAL I-F SIGNALS SUPPLIED BY SEPARATE CONVERTERS IN A QAM/VSB DIGITAL TV RECEIVER

[75] Inventor: Allen LeRoy Limberg, Vienna, Va.

[73] Assignee: SamSung Electronics Co., Ltd., Kyungki-do, Rep. of Korea

[21] Appl. No.: 09/229,608

[22] Filed: Jan. 13, 1999

Related U.S. Application Data

[60] Provisional application No. 60/075,423, Feb. 20, 1998.

[51] Int. Cl.[7] .................. H04L 27/14; H04N 5/455
[52] U.S. Cl. .................. 375/324; 375/321; 348/726; 348/558
[58] Field of Search .................. 375/316, 321, 375/324; 348/725, 726, 678, 558

[56] References Cited

U.S. PATENT DOCUMENTS

| | | | |
|---|---|---|---|
| 5,506,636 | 4/1996 | Patel et al. | 348/725 |
| 5,715,012 | 2/1998 | Patel et al. | 348/555 |
| 5,966,188 | 10/1999 | Patel et al. | 348/726 |

*Primary Examiner*—Temesghen Ghebretinsae
*Attorney, Agent, or Firm*—Robert E. Bushnell, Esq.

[57] ABSTRACT

A QAM/VSB digital television (DTV) receiver of plural conversion type uses the same circuitry up to a penultimate IF amplifier for receiving DTV signals no matter whether they use QAM or VSB modulation. The converter used for generating final IF signals when QAM modulation is received and the converter used for generating final IF signals when VSB modulation is received have respective mixers and respective local oscillators with separate automatic frequency and phase control. The use of such separate converters avoids a lock-out from VSB reception mode that otherwise can occur during the reception of DTV signals with VSB modulation.

34 Claims, 9 Drawing Sheets

| SUBHARMONIC OF 43.05 MHz | SUBHARMONIC OF 21.52 MHz | QAM CARRIER FREQUENCY IN MHz FOR FINAL IF BAND | LOCAL OSCILLATOR 30 FREQUENCY IN MHz |
|---|---|---|---|
| 7 | 3 | 5.381 | 38.619 OR 49.381 |
| 8 |   | 4.783 | 39.217 OR 48.753 |
| 9 | 4 | 4.305 | 39.695 OR 48.305 |
| 10 |   | 3.914 | 40.086 OR 47.914 |
| 11 | 5 | 3.587 | 40.413 OR 47.587 |

TABLE OF LOCAL OSCILLATOR 30 FREQUENCIES

*FIG. 9*

| SUBHARMONIC OF 43.05 MHz | SUBHARMONIC OF 21.52 MHz | VSB CARRIER FREQUENCY IN MHz FOR FINAL IF BAND | LOCAL OSCILLATOR 35 FREQUENCY IN MHz |
|---|---|---|---|
| 3 | 1 | 10.762 | 37.006 |
| 4 |   | 8.610 | 37.397 |
| 5 | 2 | 7.175 | 37.723 |
| 6 |   | 6.150 | 37.999 |
| 7 | 3 | 5.381 | 38.236 |

TABLE OF LOCAL OSCILLATOR 35 FREQUENCIES
FOR FULL SIDEBAND BELOW VESTIGIAL SIDEBAND

*FIG. 10*

| SUBHARMONIC OF 43.05 MHz | SUBHARMONIC OF 21.52 MHz | VSB CARRIER FREQUENCY IN MHz FOR FINAL IF BAND | LOCAL OSCILLATOR 35 FREQUENCY IN MHz |
|---|---|---|---|
| 8 |  | 4.783 | 36.527 |
| 9 | 4 | 4.305 | 37.005 |
| 10 |  | 3.914 | 37.396 |
| 11 | 5 | 3.587 | 37.723 |
| 12 |  | 3.311 | 37.999 |
| 13 | 6 | 3.074 | 38.236 |
| 14 |  | 2.869 | 38.441 |
| 15 | 7 | 2.690 | 38.620 |
| 16 |  | 2.532 | 38.788 |
| 17 | 8 | 2.391 | 38.919 |
| 18 |  | 2.265 | 39.045 |
| 19 | 9 | 2.152 | 39.158 |
| 20 |  | 2.050 | 39.260 |
| 21 | 10 | 1.956 | 39.354 |
| 22 |  | 1.871 | 39.439 |
| 23 | 11 | 1.793 | 39.517 |
| 24 |  | 1.722 | 39.588 |
| 25 | 12 | 1.655 | 39.655 |
| 26 |  | 1.594 | 39.716 |
| 27 | 13 | 1.537 | 39.773 |
| 28 |  | 1.484 | 39.826 |
| 29 | 14 | 1.435 | 39.875 |
| 30 |  | 1.388 | 39.922 |
| 31 | 15 | 1.345 | 39.965 |
| 32 |  | 1.304 | 40.006 |

TABLE OF LOCAL OSCILLATOR 35 FREQUENCIES
FOR FULL SIDEBAND ABOVE VESTIGIAL SIDEBAND

*FIG. 11*

SYNCHRODYNING OF VSB AND QAM FINAL I-F SIGNALS SUPPLIED BY SEPARATE CONVERTERS IN A QAM/VSB DIGITAL TV RECEIVER

This application is filed under 35 U.S.C. 111(a) claiming pursuant to 35 U.S.C. 119(e)(1) benefit of the filing date of provisional application Ser. No. 60/075,423 filed Feb. 20, 1998, pursuant to 35 U.S.C. 111(b).

The invention relates to radio receivers having the capability of receiving digital television (DTV) signals, no matter whether they are transmitted using quadrature amplitude modulation (QAM) of the principal carrier wave or they are transmitted using vestigial sideband (VSB) amplitude modulation of the principal carrier wave.

BACKGROUND OF THE INVENTION

A Digital Television Standard published Sep. 16, 1995 by the Advanced Television Systems Committee (ATSC) specifies vestigial sideband (VSB) signals for transmitting digital television (DTV) signals in 6-MHz-bandwidth television channels such as those currently used in over-the-air broadcasting of National Television System Committee (NTSC) analog television signals within the United States. The VSB DTV signal is designed so its spectrum is likely to interleave with the spectrum of a co-channel interfering NTSC analog TV signal. This is done by positioning the pilot carrier and the principal amplitude-modulation sideband frequencies of the DTV signal at odd multiples of one-quarter the horizontal scan line rate of the NTSC analog TV signal that fall between the even multiples of one-quarter the horizontal scan line rate of the NTSC analog TV signal, at which even multiples most of the energy of the luminance and chrominance components of a co-channel interfering NTSC analog TV signal will fall. The video carrier of an NTSC analog TV signal is offset 1.25 MHz from the lower limit frequency of the television channel. The carrier of the DTV signal is offset from such video carrier by 59.75 times the horizontal scan line rate of the NTSC analog TV signal, to place the carrier of the DTV signal about 309,877.6 kHz from the lower limit frequency of the television channel. Accordingly, the carrier of the DTV signal is about 2,690122.4 Hz from the middle frequency of the television channel. The exact symbol rate in the Digital Television Standard is (684/286) times the 4.5 MHz sound carrier offset from video carrier in an NTSC analog TV signal. The number of symbols per horizontal scan line in an NTSC analog TV signal is 684, and 286 is the factor by which horizontal scan line rate in an NTSC analog TV signal is multiplied to obtain the 4.5 MHz sound carrier offset from video carrier in an NTSC analog TV signal. The symbol rate is $10.762238*10^6$ symbols per second, which can be contained in a VSB signal extending 5.381119 MHz from DTV signal carrier. That is, the VSB signal can be limited to a band extending 5.690997 MHz from the lower limit frequency of the television channel.

The ATSC standard for digital HDTV signal terrestrial broadcasting in the United States of America is capable of transmitting either of two high-definition television (HDTV) formats with 16:9 aspect ratio. One HDTV format uses 1920 samples per scan line and 1080 active horizontal scan lines per 30 Hz frame with 2:1 field interlace. The other HDTV format uses 1280 luminance samples per scan line and 720 progressively scanned scan lines of television image per 60 Hz frame. The ATSC standard also accommodates the transmission of DTV formats other than HDTV formats, such as the parallel transmission of four television signals having normal definition in comparison to an NTSC analog television signal.

DTV transmitted by vestigial-sideband (VSB) amplitude modulation (AM) during terrestrial broadcasting in the United States of America comprises a succession of consecutive-in-time data fields each containing 313 consecutive-in-time data segments. There are 832 symbols per data segment. So, with the symbol rate being 10.76 MHz, each data segment is of 77.3 microseconds duration. Each segment of data begins with a line synchronization code group of four symbols having successive values of +S, −S, −S and +S. The value +S is one level below the maximum positive data excursion, and the value −S is one level above the maximum negative data excursion. The initial line of each data field includes a field synchronization code group that codes a training signal for channel-equalization and multipath suppression procedures. The training signal is a 511-sample pseudo-random noise sequence (or "PN-sequence") followed by three 63-sample PN sequences. The middle 63-sample PN sequence is transmitted in accordance with a first logic convention in the first line of each odd-numbered data field and in accordance with a second logic convention in the first line of each even-numbered data field, the first and second logic conventions being one's complementary respective to each other. The remainder of the training signal is transmitted with same logic convention in all data fields.

The subsequent lines of each data field contain data that have been Reed-Solomon forward error-correction coded. In over-the-air broadcasting the error-correction coded data are then trellis coded using twelve interleaved trellis codes, each a $\frac{2}{3}$ rate trellis code with one uncoded bit. Trellis coding results are parsed into three-bit groups for over-the-air transmission in eight-level one-dimensional-constellation symbol coding, which transmission is made without symbol pre-coding separate from the trellis coding procedure. Trellis coding is not used in cablecasting. The error-correction coded data are parsed into four-bit groups for transmission as sixteen-level one-dimensional-constellation symbol coding, which transmissions are made without precoding.

The VSB signals have their natural carrier wave, which would vary in amplitude depending on the percentage of modulation, suppressed. The natural carrier wave is replaced by a pilot carrier wave of fixed amplitude, which amplitude corresponds to a prescribed percentage of modulation. This pilot carrier wave of fixed amplitude is generated by introducing a direct component shift into the modulating voltage applied to the balanced modulator generating the amplitude-modulation sidebands that are supplied to the filter supplying the VSB signal as its response. If the eight levels of 4-bit symbol coding have normalized values of −7, −5, −3, −1, +1, +3, +5 and +7 in the carrier modulating signal, the pilot carrier has a normalized value of 1.25. The normalized value of +S is +5, and the normalized value of −S is −5.

VSB signals using 8-level symbol coding will be used in over-the-air broadcasting within the United States, and VSB signals using 16-level symbol coding are proposed in the ATSC standard for use in over-the-air narrowcasting systems or in cable-casting systems. However, the standard practice in such systems is to use suppressed-carrier quadrature amplitude modulation (QAM) signals rather than VSB signals. This presents television receiver designers with the challenge of designing receivers that are capable of receiving either type of transmission and of automatically selecting suitable receiving apparatus for the type of transmission currently being received. Such receivers are denominated "QAM/VSB digital television receivers" in this specification and are sometimes referred to as "VSB/QAM digital television receivers". The design of QAM/VSB DTV receivers with intermediate-frequency (IF) amplifiers used in common for both QAM and VSB signals has been described by C. B. Patel and the inventor in their U.S. Pat. No. 5,506,636 issued Apr. 9, 1996, entitled HDTV SIGNAL RECEIVER WITH IMAGINARY-SAMPLE-PRESENCE DETECTOR FOR QAM/VSB MODE SELECTION, and incorporated herein by reference. This type of QAM/VSB DTV receiver is also described by C. B. Patel and the inventor in U.S. patent application Ser. No. 08/266,753 filed Jun. 28, 1994 and entitled RADIO RECEIVER FOR RECEIVING BOTH VSB AND QAM DIGITAL HDTV SIGNALS, U.S. Pat. No. 5,715,012 issued Feb. 3, 1998 and entitled RADIO RECEIVERS FOR RECEIVING BOTH VSB AND QAM DIGITAL HDTV SIGNALS, and in U.S. patent application Ser. No. 08/773,949 filed Dec. 26, 1996 and entitled RADIO RECEIVERS FOR RECEIVING BOTH VSB AND QAM DIGITAL HDTV SIGNALS. U.S. Pat. Nos. 5,506,636 and 5,715,012 and U.S. patent application Ser. No. 08/266,753 were written presuming that the carrier frequency of a VSB DTV signal would be 625 kHz above lowest channel frequency, as earlier proposed by a subcommittee of the Advanced Television Systems Committee. This specification presumes that the carrier frequency of a VSB DTV signal is nominally 310 kHz above lowest channel frequency, as specified in Annex A of the Digital Television Standard published Sep. 16, 1995.

The QAM/VSB DTV receivers described in U.S. Pat. No. 5,506,636 are subject to a problem of being locked out of VSB reception at times when VSB rather than QAM signals are being received. The inventor traces this problem, which sometimes occurs, to arising because one of the later local oscillators in each of these plural-conversion receivers receives automatic-frequency-and-phase-control (AFPC) signal as selected from one of two sources, depending on whether the DTV signal being currently received is QAM or VSB in nature. In the QAM/VSB DTV receiver described in U.S. Pat. No. 5,506,636, the selection of AFPC signal is controlled by an imaginary sample presence detector responsive to the circuitry used for synchrodyning a possible VSB signal to baseband. In order for the imaginary sample presence detector to operate satisfactorily, however, the circuitry used for synchrodyning a possible VSB signal to baseband has to be properly synchronized with regard to the VSB pilot carrier. Unless this state of proper synchronization is in existence, imaginary samples will occur. Responsive to the occurrence of these imaginary samples, the imaginary sample presence detector will condition the QAM/VSB DTV receiver for QAM reception. The circuitry used for synchrodyning a possible QAM signal to baseband will be referred to for providing AFPC signal for the controlled later local oscillator, rather than the circuitry used for synchrodyning a possible VSB signal to baseband, so proper synchronization with regard to the VSB pilot carrier is not forced. Proper synchronization can occur accidentally, in which case, the imaginary sample presence detector will condition the QAM/VSB DTV receiver for VSB reception. Slippage of phase between the VSB pilot carrier and the carrier generated for synchrodyning the VSB signal to baseband makes such accident likely. But sometimes there is no substantial slippage of phase between the VSB pilot carrier and the carrier generated for synchrodyning the VSB signal to baseband, and the phase persists in being incorrect. Under such conditions the lock-out from VSB reception mode occurs.

A similar problem of being locked out of VSB reception at times when VSB rather than QAM signals are being received is sometimes observed in the QAM/VSB DTV receivers described in U.S. Pat. No. 5,715,012 and in U.S. patent applications Ser. Nos. 08/266,753 and 08/773,949, in which receivers the selection of AFPC signal is controlled by a VSB pilot carrier presence detector responsive to the circuitry used for synchrodyning a possible VSB signal to baseband. The sensitivity to the difference in phase between the VSB pilot carrier and the carrier generated for synchrodyning the VSB signal to baseband tends to be less critical for the VSB pilot carrier presence detector to provide indication that a VSB pilot carrier is being detected than for the imaginary sample presence detector to indicate the non-occurrence of imaginary samples. Nevertheless, if there is no substantial slippage of phase between the VSB pilot carrier and the carrier generated for synchrodyning the VSB signal to baseband, and the phase persists in being 90° away from correct synchronization, the lock-out from VSB reception mode occurs.

A primary objective of the inventor was to prevent any lock-out from VSB reception mode in a QAM/VSB digital television receiver using bandpass trackers for QAM reception and for VSB reception.

SUMMARY OF THE INVENTION

The invention is embodied in a radio receiver for receiving a selected digital television signal, irrespective of whether it is a quadrature-amplitude-modulation (QAM) or a vestigial-sideband (VSB) digital television signal. The radio receiver includes front-end circuitry for selecting the selected digital television signal and converting it with amplification to at least a first amplified penultimate intermediate-frequency signal; a first frequency converter for converting to a first final intermediate-frequency signal the first amplified penultimate intermediate-frequency signal, the first frequency converter including a first controlled oscillator the frequency and phase of its oscillations controlled by a first automatic-frequency-and-phase-control signal; a first analog-to-digital converter for digitizing the first final intermediate-frequency signal to generate a digitized first final intermediate-frequency signal; circuitry for synchrodyning any QAM digital television signal in said digitized first final intermediate-frequency signal to baseband, thus to generate a first in-phase baseband signal and a first quadrature-phase baseband signal; and circuitry for synchrodyning any VSB digital television signal in a digitized second final intermediate-frequency signal to baseband, thus to generate a second in-phase baseband signal and a second quadrature-phase baseband signal. The radio receiver of the invention is characterized by a second frequency converter for converting to a second final intermediate-frequency signal a second amplified penultimate intermediate-frequency signal supplied from the front-end circuitry, which second frequency converter includes a second controlled oscillator the frequency and phase of its oscillations controlled by a second automatic-frequency-and-phase-control signal, and by a second analog-to-digital converter for digitizing the second final intermediate-frequency signal to generate the digitized second final intermediate-frequency signal. There is first automatic-frequency-and-phase-control circuitry for generating the first automatic-frequency-and-phase-control signal responsive to the first in-phase baseband signal and the first quadrature-phase baseband signal, and there is second automatic-frequency-and-phase-control circuitry for generating the second automatic-frequency-and-phase-control signal responsive to said second quadrature-phase baseband signal.

In contrast to the QAM/VSB DTV receivers described in the "BACKGROUND OF THE INVENTION", the first and second final IF signals digitized for respective application to the circuitry for synchrodyning any QAM signal to baseband and to the circuitry for synchrodyning any VSB signal to baseband are supplied from separate first and second frequency converters respectively comprising a first controlled oscillator and a second controlled oscillator, rather than being supplied from the same frequency converter. Furthermore, the first AFPC signal applied to the first controlled oscillator is responsive neither to the second in-phase baseband signal nor to the second quadrature-phase baseband signal; and the second AFPC signal applied to the second controlled oscillator is responsive neither to the first in-phase baseband signal nor to the first quadrature-phase baseband signal. These separate AFPC loops for the first controlled oscillator and the second controlled oscillator avoid the VSB reception lock-out problem described in the "BACKGROUND OF THE INVENTION". Furthermore, additional flexibilty in the design of the circuitry for synchrodyning any QAM signal to baseband and the circuitry for synchrodyning any VSB signal to baseband obtains, since the nominal frequencies of oscillation of the first and second controlled oscillators need not be the same.

BRIEF DESCRIPTION OF THE DRAWING

Each of FIGS. 1, 2, 3 and 4 is a block schematic diagram of the radio receiver portions of a DTV receiver constructed in accordance with the invention.

FIG. 9 is a table of design frequencies for the local oscillator used to supply the oscillations used to heterodyne a penultimate intermediate-frequency band centered at 44 MHz down to various final intermediate-frequency bands for QAM signals.

FIG. 10 is a table of design frequencies for the local oscillator used to supply the oscillations used to heterodyne a penultimate intermediate-frequency band centered at 44 MHz down to various final intermediate-frequency bands for VSB signals, presuming the vestigial sideband to be located above the full sideband in frequency both in the penultimate IF band and the final IF band.

FIG. 11 is a table of design frequencies for the local oscillator used to supply the oscillations used to heterodyne a penultimate intermediate-frequency band centered at 44 MHz down to various final intermediate-frequency bands for VSB signals, presuming the vestigial sideband to be located below the full sideband in frequency in both in the penultimate IF band and in the final IF band.

DETAILED DESCRIPTION

Figure 1:
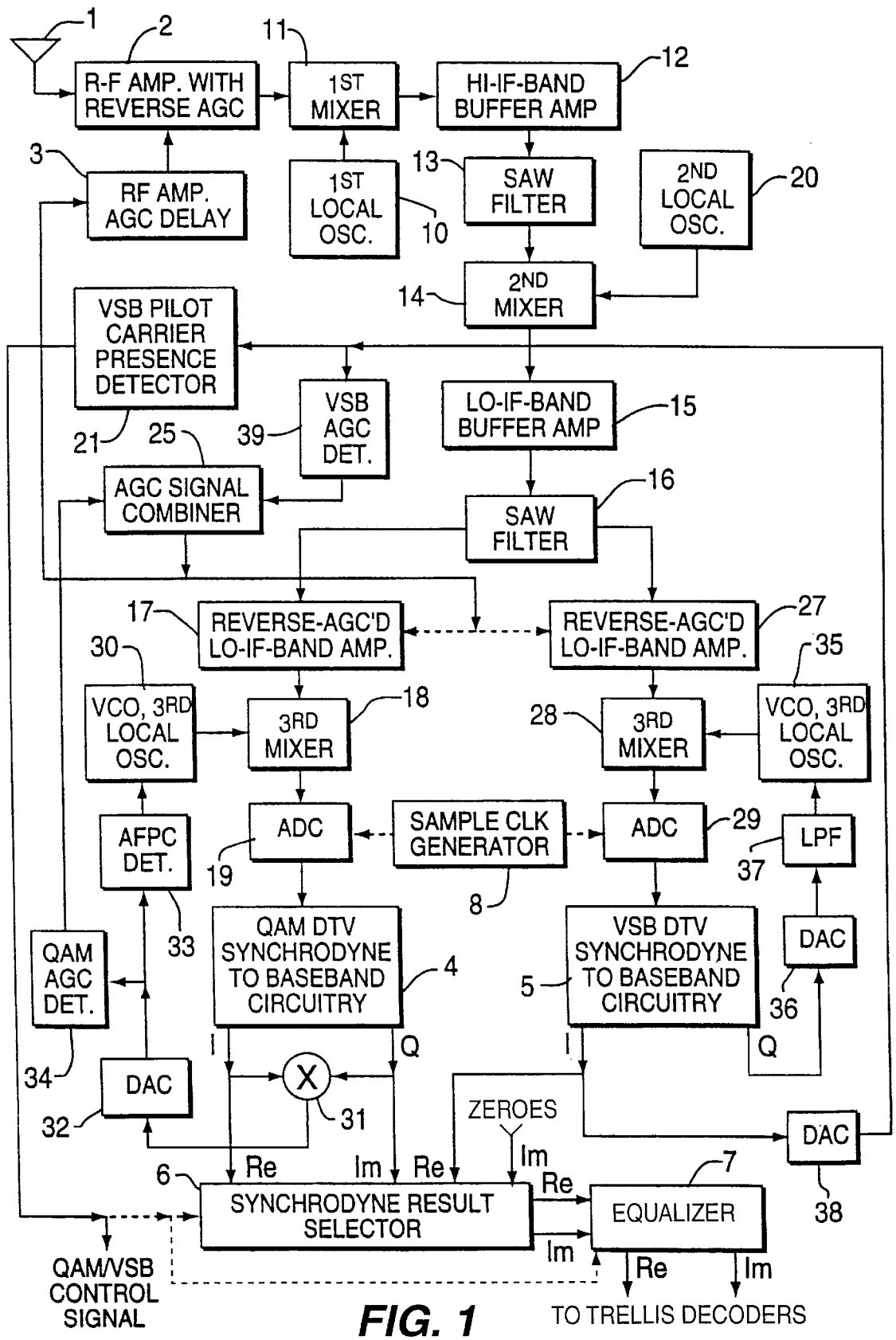

FIG. 1 shows the radio receiver portions of a DTV receiver constructed in accordance with the invention, which receiver is capable of receiving either QAM or VSB digital TV signals. An antenna 1 is a representative source of TV signals in ultra high frequency (UHF) band, or possibly in the very high frequency (VHF) band, which TV signals are applied to a radio-frequency (RF) amplifier 2. The RF amplifier 2 is provided with a tracking preselection filter for selecting a portion of the one of the television broadcast bands the television signal selected for reception reposes in. The RF amplifier 2 is reverse-AGC'd in delayed response to AGC signals applied to RF amplifier 2 via an AGC delay circuit 3. The RF amplifier 2 supplies amplified response to the television signal selected for reception.

This amplified response is mixed with a super-heterodyning signal from a first local oscillator 10 for upconversion to a high intermediate-frequency-band, which is above the highest frequency television channel in the ultra-high frequency (UHF) spectrum. In line with current TV practice, the first local oscillator 10 is usually a frequency synthesizer for generating the super-heterodyning signal of a frequency in selected ratio with the frequency of a component controlled oscillator, with the frequency of the controlled oscillator being controlled by AFT signal. This preferred practice results in the sensitivity of the super-heterodyning signal frequency to AFT signal being substantially the same for all received TV channels. The 6-MHz-wide selected radio-frequency signal supplied by the RF amplifier 2 is upconverted to a high-band intermediate-frequency signal in a first mixer 11, which preferably is of a doubly-balanced linear-multiplication type. The high-band intermediate-frequency signal is centered at an ultra-high frequency above that portion of the UHF band containing assigned channels for television broadcasting, placing the image frequencies well above 1 GHz so they are easily rejected by a bandpass coupling network at the output of the first mixer 11.

A high-intermediate-frequency-band buffer amplifier 12 applies the high-band IF signal to a surface-acoustic-wave (SAW) filter 13. The buffer amplifier 12 provides fixed gain to make up the 10–12 dB insertion loss of the SAW filter 13 and drives the SAW filter 13 from a fixed source impedance chosen to avoid unwanted reflections. The SAW filter 13 has a substantially linear-phase, flat-amplitude response that has −1 dB to −1 dB bandwidth of substantially 6 MHz, which passband is symmetrical around a midband frequency. By way of example, the UHF IF signal can be centered at 916 MHz. A gallium arsenide SAW filter 13 can be operated satisfactorily in this frequency range. The response of the SAW filter 13 is supplied to a second mixer 14 for downconversion to a low-band intermediate-frequency signal centered at a very high frequency below that portion of the VHF band containing assigned channels for television broadcasting. The lowband IF signal can be centered at about 44 MHz, as common in analog TV practice. A local oscillator 20, which is preferably of a crystal-controlled type, supplies a heterodyning signal of stable fixed frequency to the second mixer 14 for implementing the downconversion therein. The second mixer 14 is preferably of a doubly-balanced linear-multiplication type.

A low-intermediate-frequency-band buffer amplifier 15 applies the low-band IF signal to a surface-acoustic-wave (SAW) filter 16 designed for flat response over at least a 6 MHz bandwidth. The buffer amplifier 15 provides fixed gain to make up the 10–12 dB insertion loss of the SAW filter 16 and drives the SAW filter 16 from a fixed source impedance chosen to avoid unwanted reflections. The SAW filter 16 has a substantially linear-phase response over a bandwidth in excess of 6 MHz, so that the earlier SAW filter 13 determines the channel characteristics of the first IF amplifier chain. A lithium niobate SAW filter 16 can be operated satisfactorily in the frequency range centered at about 44 MHz. The response of the SAW filter 16 is supplied as input signals to automatic-gain-controlled low-intermediate-frequency-band (VHF) amplifiers 17 and 27. The low-IF-band amplifier 17 supplies its response as input signal to a third mixer 18 for supplying a final intermediate-frequency signal for digitization by an analog-to-digital converter 19 for application to digital synchrodyne circuitry 4, which synchronously detects in-phase (I) QAM carrier wave modulation and synchronously detects quadrature-phase (Q) QAM carrier wave modulation. The low-IF-band amplifier 27 supplies its response as input signal to a third mixer 28 for supplying a final intermediate-frequency signal for digitization by an analog-to-digital converter 29 for application to digital synchrodyne circuitry 5, which synchronously detects in-phase (I) VSB carrier wave modulation and synchronously detects quadrature-phase (Q) VSB carrier wave modulation.

Insofar as the invention is concerned, in FIG. 1 elements 2, 10–17, 20 and 27 constitute front-end circuitry for supplying penultimate interrnediate-frequency signals to the third mixers 18 and 28. In the triple-conversion radio receiver shown in FIG. 1 these penultimate intermediate-frequency signals are the second intermediate frequency signals in the VHF band.

The response of the AGC'd IF amplifier 17 and VHF local oscillations from a voltage-controlled third local oscillator 30 are applied as first and second input signals, respectively, to the third mixer 18. The third mixer 18 is for downconverting the amplified first VHF intermediate-frequency signal from the AGC'd IF amplifier 17 to generate a first final intermediate-frequency signal offset a few MHz from baseband for digitization by the ADC 19.

Digital synchrodyne circuitry 4 is designed for responding to QAM DTV signal in this first final intermediate-frequency signal to recover respective in-phase (I) and quadrature-phase (Q) baseband signals that are descriptive of QAM symbols. A digital multiplier 31, which in order to secure speedy operation is preferably implemented in read-only memory (ROM), multiplies these I and Q baseband signals together. The resulting product which contains samples descriptive of a low frequency beat term and of a term at symbol rate is converted to analog form by a digital-to-analog converter 32. The term at symbol rate in the DAC 32 response is supplied to an automatic-frequency-and-phase-control detector 33, and the AFPC detector 33 response adjusts the frequency and phase of the voltage-controlled third local oscillator 30 to reduce the low frequency beat term in the DAC 32 response to zero frequency. This feedback control of the voltage-controlled third local oscillator 30 is a species of Costas loop. A QAM automatic-gain-control detector 34 responds to the DAC 32 response to generate a first input signal for an AGC signal combiner 25, which applies an automatic-gain-control (AGC) signal to the low-IF-band amplifier 17. In order better to preserve linearity of the QAM digital modulation in the low-IF-band amplifier 17 response, reverse AGC is employed with this amplifier.

The response of the AGC'd IF amplifier 27 and VHF local oscillations from a voltage-controlled third local oscillator 35 are applied as first and second input signals, respectively, to the third mixer 28. The third mixer 28 is for downconverting the amplified second VHF intermediate-frequency signal from the AGC'd IF amplifier 27 to generate a second final intermediate-frequency signal offset a few MHz from baseband for digitization by the ADC 29.

Digital synchrodyne circuitry 5 is designed for responding to VSB DTV signal in this second final intermediate-frequency signal to recover respective in-phase (I) and quadrature-phase (Q) baseband signals, at the least the former of which baseband signals is descriptive of VSB AM symbols. The quadrature-phase baseband signal from the synchrodyne circuitry 5 is converted to analog form by a digital-to-analog converter 36, and a lowpass filter 37 extracts a low frequency beat term from the DAC 36 response for application to the voltage-controlled third local oscillator 35 as an automatic-frequency-and-phase-control (AFPC) signal therefor. The in-phase baseband signal from the synchrodyne circuitry 5 is converted to analog form by a digital-to-analog converter 38, and a VSB automatic-gain-control detector 34 responds to the DAC 38 response to generate a second input signal for an AGC signal combiner 25, which applies an automatic-gain-control (AGC) signal to the low-IF-band amplifier 27. In order better to preserve linearity of the VSB digital modulation in the low-IF-band amplifier 27 response, reverse AGC is employed with this amplifier.

Supposedly only one of the respective responses from the AGC detectors 34 and 39 will indicate need for reducing radio receiver gain, so the AGC signal combiner 25 can be configured to act as an analog OR circuit for those responses, developing AGC signals responsive only to that one of the respective responses from the AGC detectors 34 and 39 which most indicates need for reducing radio receiver gain. The AGC signal combiner 25 supplies AGC signals to both the low-IF-band amplifiers 17 and 27. The AGC signal combiner 25 forwards an AGC signal to the AGC delay circuit 3 for reducing the gain of the RF amplifier 2 when very strong signal reception obtains.

The presence or absence in the DAC 36 response of a direct term arising from the synchronous detection of ATSC signal pilot carrier is sensed by a threshold detector 21 operating as a VSB pilot carrier presence detector. Indications of the presence or absence of ATSC signal pilot carrier by the VSB pilot carrier presence detector 21 are used as control signal by a synchrodyne result selector 6. These indications are also supplied to an amplitude-and-group-delay equalizer 7 for selecting the configuration of digital filters in the equalizer 7 to suit the DTV signal being currently received, depending on whether it is a QAM or a VSB AM signal.

Responsive to the VSB pilot carrier presence detector 21 indicating the absence of ATSC signal pilot carrier, the synchrodyne result selector 6 selects the in-phase baseband signal from the digital synchrodyne circuitry 4 for application to an amplitude-and-group-delay equalizer 7 as real sample stream and selects the quadrature-phase baseband signal from the digital synchrodyne circuitry 4 for application to the equalizer 7 as imaginary sample stream. The two selection procedures are performed synchronously, rather than in staggered phase. Presuming the sample rate to be $21.52*10^6$ samples per second, the equalizer 7 can be operated as a fractional equalizer, with the digital filter circuitry in the equalizer clocked at the $21.52*10^6$ samples per second rate that is four times the baud rate of the QAM symbols. Preferred designs use rate reduction filtering of the real and imaginary sample streams the equalizer 7 receives from the digital synchrodyne circuitry 4 for QAM. From the standpoint of utilizing hardware also used for equalization of the stream of real samples of demodulated VSB AM symbols, is convenient to time-division multiplex the real and imaginary sample streams of demodulated QAM symbols on an alternate sample basis and then to operate the rest of the digital equalization filtering on a dual-phase basis to provide complex equalization during QAM reception. Rate reduction filtering at the input of the equalizer 7 for demodulated QAM can be such as to operate the equalizer as a synchronous equalizer for demodulated QAM or as a fractional equalizer for demodulated QAM. If the equalizer 7 is operated as a fractional equalizer for demodulated QAM, it will incorporate a rate reduction filter at its output to a trellis decoder 91 (shown in FIG. 8) for QAM signal.

In FIG. 1, responsive to the VSB pilot carrier presence detector 21 indicating the presence of ATSC signal pilot carrier, the synchrodyne result selector 6 selects the in-phase baseband signal from the digital synchrodyne circuitry 5 for application to the amplitude-and-group-delay equalizer 7 as a real sample stream and selects a stream of arithmetic zeroes for application to the equalizer 7 as an imaginary sample stream. Presuming the sample rate in each stream to be $21.52*10^6$ samples per second, the equalizer 7 can be conditioned to operate as a fractional equalizer during VSB AM reception, with the digital filter circuitry in the equalizer clocked at the $21.52*10^6$ samples per second rate, which is twice baud rate for the VSB AM symbols. Alternatively, the equalizer 7 can be provided with a rate reduction filter at its input. Still presuming the sample rate in each stream to be $21.52*10^6$ samples per second, the rate reduction filter can resample to the $10.76* 10^6$ samples per second baud rate for VSB AM, to operate the equalizer 7 as a synchronous equalizer, or can resample to a lower rate, such as 4/3 baud rate, to operate the equalizer 7 as a fractional equalizer with fewer taps. If the equalizer 7 is operated as a fractional equalizer for demodulated VSB AM, it will incorporate a rate reduction filter at its output to a trellis decoder 92 (shown in FIG. 8) for VSB AM signal.

Figure 2:
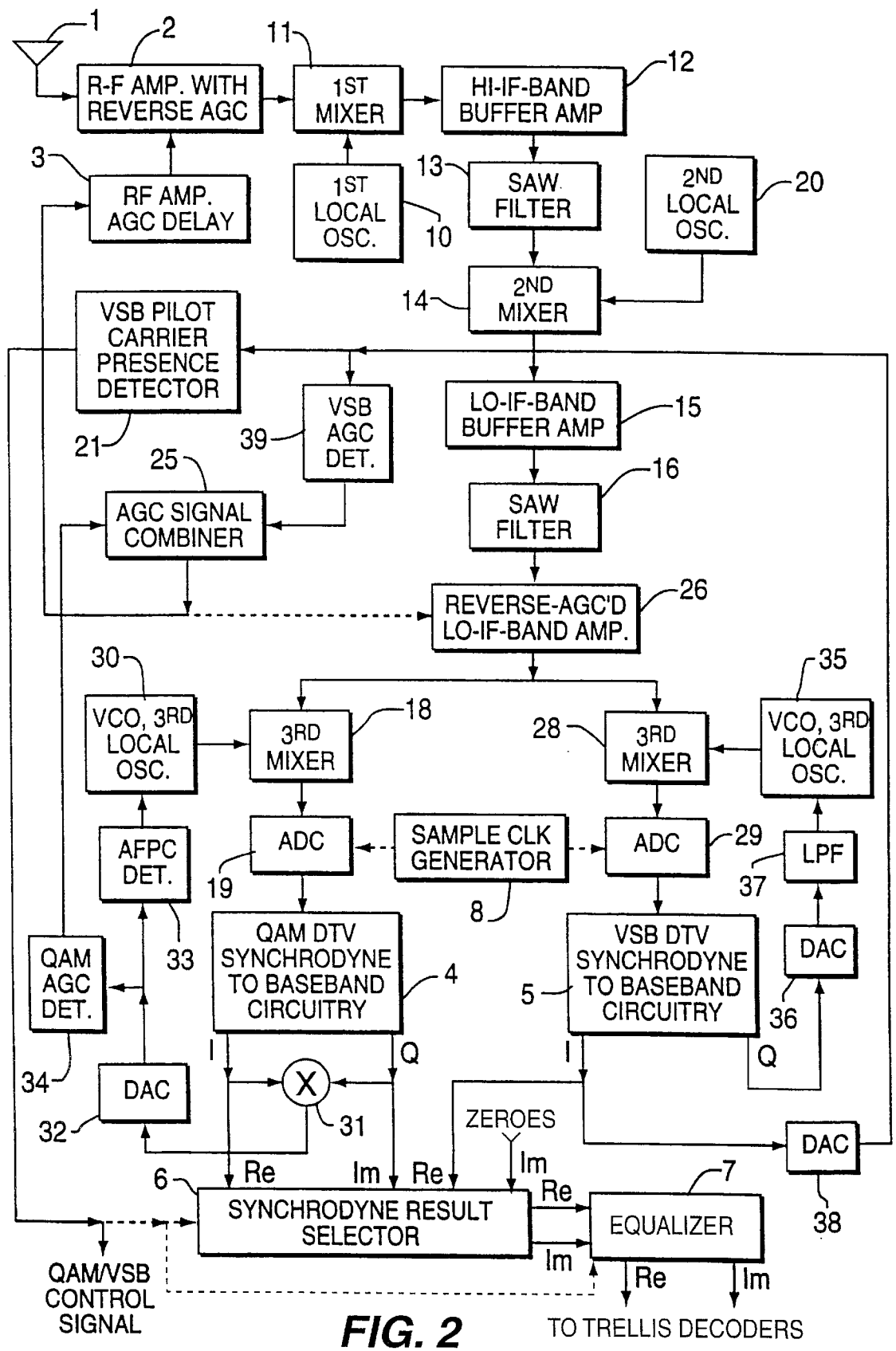

FIG. 2 shows the radio receiver portions of a QAM/VSB DTV receiver which differs from the FIG. 1 QAM/VSB DTV receiver in that reverse-AGC'd low-IF-band amplifiers 17 and 27 are replaced by a single reverse-AGC'd low-IF-band amplifier 26 for amplifying the response of the SAW filter 16. The third mixers 18 and 28 receive the response of this single reverse-AGC'd low-IF-band amplifier 26 as their respective low-IF-band DTV input signals, rather than the respective responses of the reverse-AGC'd low-IF-band amplifiers 17 and 27. The response of the AGC signal combiner 25 is applied to the low-IF-band amplifier 26 as reverse AGC signal. Insofar as the invention is concerned, in FIG. 2 elements 2, 10–16, 20, and 26 constitute front-end circuitry for supplying penultimate intermediate-frequency signals to the third mixers 18 and 28.

Figure 3:
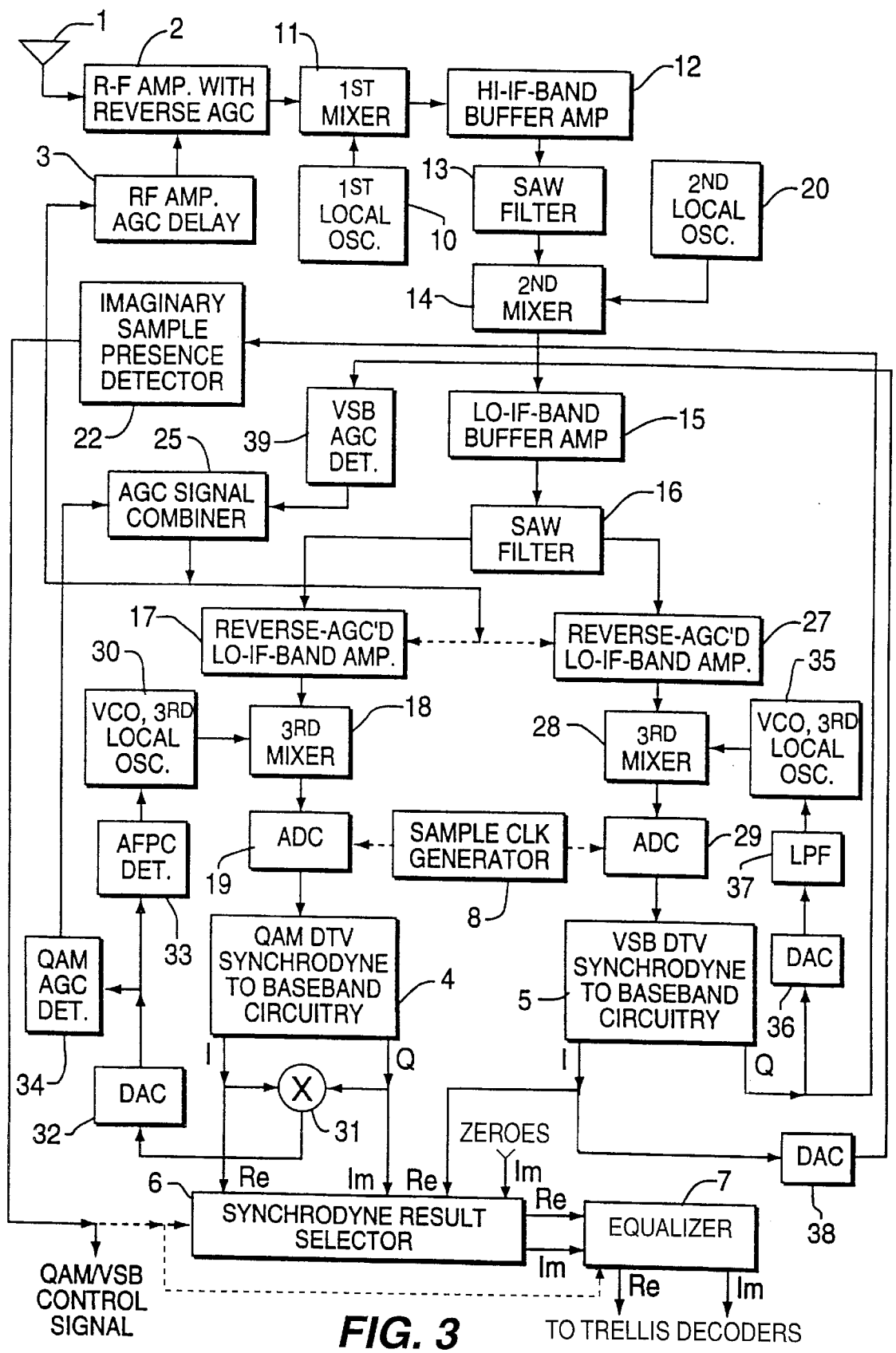
Figure 4:
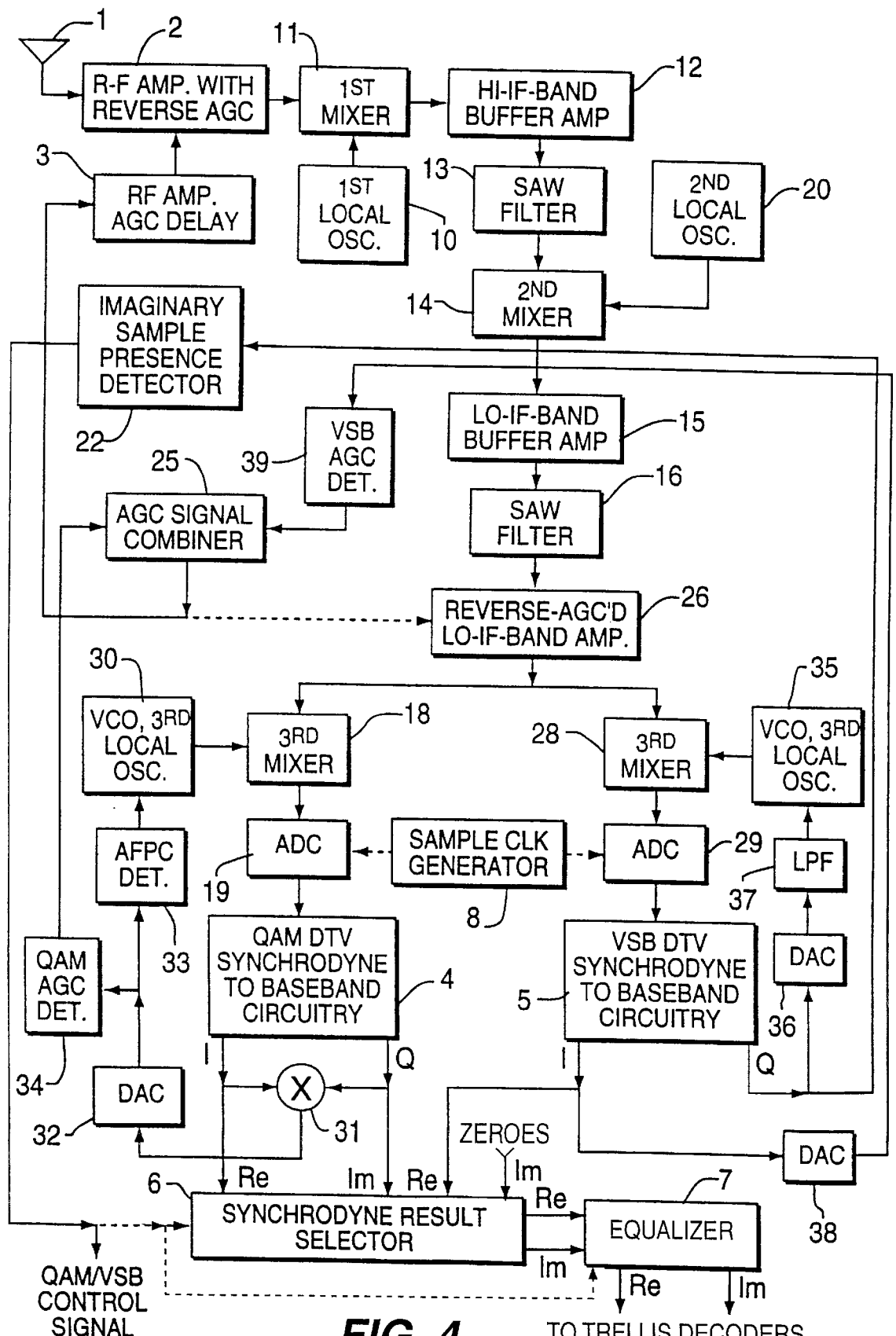

FIGS. 3 and 4 shows the radio receiver portions of QAM/VSB DTV receivers that differ from those shown in FIGS. 1 and 2 respectively in that rather than the QAM/VSB CONTROL SIGNAL is not developed by the VSB pilot carrier presence detector 21. Instead, the QAM/VSB CONTROL SIGNAL is developed by an imaginary sample presence detector 22 connected to respond to the low-frequency quadrature-phase output signal from the VSB synchrodyning circuitry 5. The imaginary sample presence detector 22 detects when there is substantial variation in the energy of the low-frequency quadrature-phase output signal, to furnish indication that a QAM signal is being received.

In still other embodiments of the invention, the QAM/VSB CONTROL SIGNAL is developed in the following way, as the output signal from a monostable circuit or its equivalent. A match filter supplies output pulses responsive to the data segment synchronization code groups, data field synchronization code groups, or to portions of data field synchronization code groups in the in-phase output signal from the VSB synchrodyning circuitry 5, received as input signal by the match filter. These pulses are threshold detected to discriminate against noise, and the threshold detector pulses are supplied to a monostable circuit to place it into its unstable state. As long as the monostable circuit is maintained in its unstable state, the QAM/VSB CONTROL SIGNAL indicates VSB AM reception. When the data synchronization signal accompanying a VSB DTV signal is not detected, the monostable circuit assumes its stable state, so the QAM/VSB CONTROL SIGNAL indicates non-reception of VSB DTV signal from which QAM reception is inferred.

Figures 5, 6:
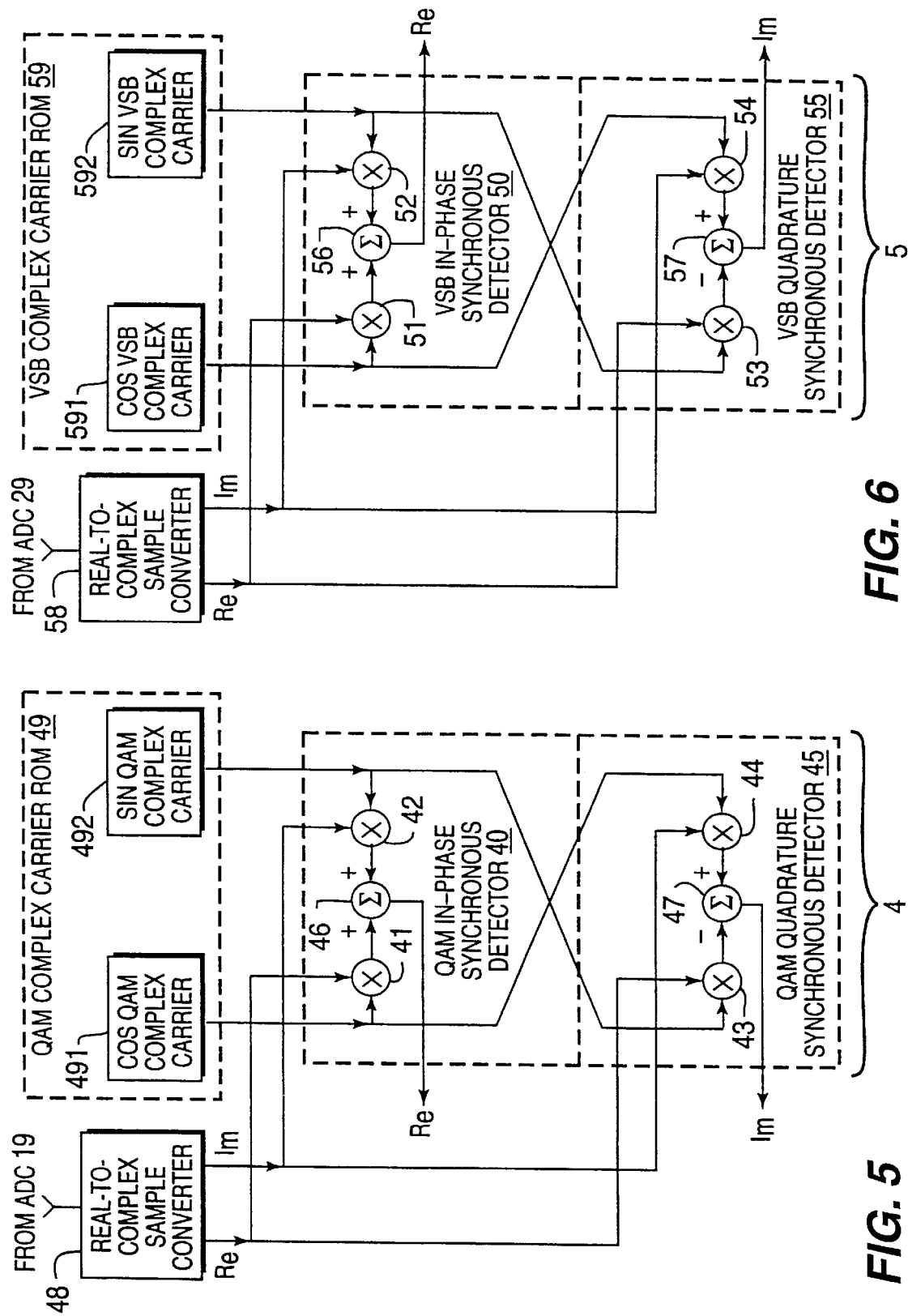
FIG. 5 is a block schematic diagram showing in greater detail the circuitry used in each of FIGS. 1, 2, 3 and 4 for synchrodyning QAM DTV signal to baseband in the digital regime.
FIG. 6 is a block schematic diagram showing in greater detail the circuitry used in each of FIGS. 1, 2, 3 and 4 for synchrodyning VSB DTV signal to baseband in the digital regime.

FIG. 5 shows in more detail the digital circuitry 4 for synchrodyning QAM DTV signals to baseband. The QAM synchrodyning circuitry 4 includes the QAM in-phase synchronous detector 40 for generating the real portion of its output signal and the QAM quadrature-phase synchronous detector 45 for generating the imaginary portion of its output signal. The QAM synchrodyning circuitry 4 is essentially a complex digital multiplier which multiplies a real-to-complex sample converter 48 response to the digital samples from the ADC 19 by a complex digital samples of QAM carrier wave read from a read-only memory 49. The QAM synchrodyning circuitry 4 includes a digital adder 46, a digital subtractor 47, and respective first, second, third and fourth digital multipliers 41–44. The QAM in-phase synchronous detector 40 includes the multiplier 41, the multiplier 42, and the adder 46 for adding the product output signals of the multipliers 41 and 42 to generate the real portion of the output signal of the QAM synchrodyning circuitry 4. The first digital multiplier 41 multiplies the real digital samples of final IF signal supplied from the real-to-complex-sample converter 48 by digital samples descriptive of the cosine of the QAM carrier that are read from a look-up table 491 in the ROM 49, and the second digital multiplier 42 multiplies the imaginary digital samples of final IF signal supplied from the real-to-complex-sample converter 48 by digital samples descriptive of the sine of the QAM carrier that are read from a look-up table 492 in the ROM 49. The QAM quadrature-phase synchronous detector 45 includes the multiplier 43, the multiplier 44, and the subtractor 47 for subtracting the product output signal of the multiplier 43 from the product output signal of the multiplier 44 to generate the imaginary portion of the output signal of the QAM synchrodyning circuitry 4. The third digital multiplier 43 multiplies the real digital samples of final IF signal supplied from the real-to-complex-sample converter 48 by digital samples descriptive of the sine of the QAM carrier that are read from the look-up table 492 in the ROM 49, and the fourth digital multiplier 44 multiplies the imaginary digital samples of final IF signal supplied from the real-to-complex-sample converter 48 by digital samples descriptive of the cosine of the QAM carrier that are read from the look-up table 491 in the ROM 49.

FIG. 6 shows in more detail the digital circuitry 5 for synchrodyning VSB DTV signals to baseband. The VSB synchrodyning circuitry 5 includes the VSB in-phase synchronous detector 50 for generating the real portion of its output signal and the VSB quadrature-phase synchronous detector 55 for generating the imaginary portion of its output signal. The VSB synchrodyning circuitry 5 is essentially a complex digital multiplier which multiplies a real-tocomplex sample converter 58 response to the digital samples from the ADC 29 by a complex digital samples of QAM carrier wave read from a read-only memory 59. The VSB synchrodyning circuitry 5 includes a digital adder 56, a digital subtractor 57, and respective first, second, third and fourth digital multipliers 51–54. The VSB in-phase synchronous detector 50 includes the multiplier 51, the multiplier 52, and the adder 56 for adding the product output signals of the multipliers 51 and 52 to generate the real portion of the output signal of the VSB synchrodyning circuitry 5. The first digital multiplier 51 multiplies the real digital samples of final IF signal supplied from the real-to-complex-sample converter 58 by digital samples descriptive of the cosine of the VSB carrier that are read from a look-up table 591 in the ROM 59, and the second digital multiplier 52 multiplies the imaginary digital samples of final IF signal supplied from the real-to-complex-sample converter 58 by digital samples descriptive of the sine of the VSB carrier that are read from a look-up table 592 in the ROM 59. The VSB quadrature-phase synchronous detector 55 includes the multiplier 53, the multiplier 54, and the subtractor 57 for subtracting the product output signal of the multiplier 53 from the product output signal of the multiplier 54 to generate the imaginary portion of the output signal of the VSB synchrodyning circuitry 5. The third digital multiplier 53 multiplies the real digital samples of final IF signal supplied from the real-to-complex-sample converter 58 by digital samples descriptive of the sine of the VSB carrier that are read from the look-up table 592 in the ROM 59, and the fourth digital multiplier 54 multiplies the imaginary digital samples of final IF signal supplied from the real-to-complex-sample converter 24 by digital samples descriptive of the cosine of the VSB carrier that are read from the look-up table 591 in the ROM 59.

Figure 7:
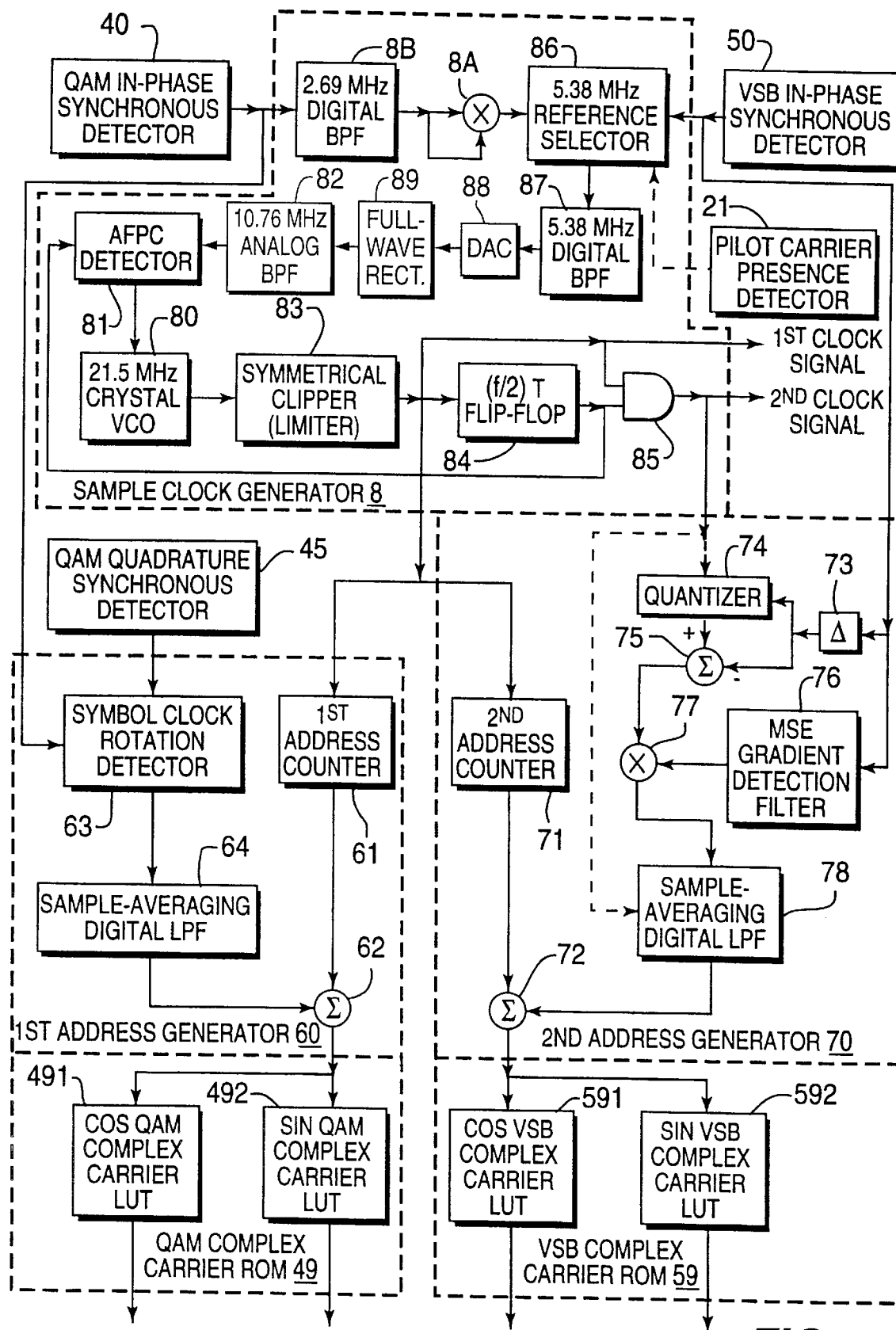
FIG. 7 is a detailed block schematic diagram of circuitry for providing the sample clock generator, the look-up table read-only memories (ROMs) for supplying digital descriptions of the complex carriers used for synchrodyning digital QAM signals and digital VSB signals at final IF signal frequencies each to baseband, and the address generators for those ROMs, which circuitry is included in certain DTV signal radio receivers of the types shown in FIGS. 1, 2, 3 and 4.

FIG. 7 shows in detail a representative construction of the sample clock generator 8. This construction includes a voltage-controlled oscillator 80 that generates cissoidal oscillations nominally of 21.52 MHz frequency. The oscillator 80 is a controlled oscillator, the frequency and phase of its oscillations being controlled by an automatic frequency and phase control (AFPC) signal voltage. This AFPC signal voltage is generated by an automatic frequency and phase control (AFPC) detector 81, which compares frequency-divided response to the oscillations of the oscillator 80 with a 10.76 MHz reference carrier supplied via an analog 10.76 MHz bandpass filter 82. Preferably, oscillator 80 is of a type using a crystal for stabilizing the natural frequency and phase of its oscillations. A symmetrical clipper or limiter 83 generates an essentially squarewave response to these cissoidal oscillations, which is used as the first clock signal for timing the sampling of the final IF signal in the ADC 22. A frequency-divider flip-flop 84 responds to transitions of the first clock signal in a prescribed sense for generating another square wave with a fundamental frequency of 10.76 MHz, half the frequency of the oscillations of the oscillator 80. This frequency-divided response to the oscillations of the oscillator 80 is supplied to the AFPC detector 81 for comparison with the 10.76 MHz reference carrier supplied via the 10.76 MHz bandpass filter 82. The frequency-divider flip-flop 84 also supplies squarewave output signal with a fundamental frequency of 10.76 MHz to an AND circuit 85 to be ANDed with the first clock signal for generating a second clock signal used by rate reduction filtering in the equalizer 7.

The 21.52 MHz reference carrier supplied from the VCO 80 is generated by extracting a component of the received DTV signal as synchrodyned to baseband, which component is of a frequency that is a subharmonic of the symbol frequency (or baud frequency), and multiplying that subharmonic of the symbol frequency by an appropriate factor in frequency multiplier circuitry. The details of this procedure will now be specifically described, first presuming the received DTV signal is a VSB signal with a 10.76 MHz symbol frequency or baud rate, and then presuming the received DTV signal is a QAM signal with a 5.38 MHz symbol frequency or baud rate.

A digital multiplexer 86 responds to the pilot carrier presence detector 21 detecting pilot carrier accompanying the received DTV signal, which is indicative that the received DTV signal is a VSB signal, to select the real samples of this signal supplied from the VSB in-phase synchronous detector 50 for application to a bandpass FIR digital filter 87 that provides a selective response centered at 5.38 MHz, which selects the first subharmonic of symbol frequency from the VSB signal. Further frequency multiplication of the 5.38 MHz is performed in the analog regime to avoid undersampling problems that arise when attempting to perform further frequency multiplication in the digital regime. An digital-to-analog converter (DAC) 88 converts the filter 87 response to analog form for application to full-wave rectification circuitry 89, which generates harmonics of the filter 87 response including a strong 10.76 MHz component as second harmonic of 5.38 MHz. The analog bandpass filter 82 responds to this 10.76 MHz second harmonic to supply the AFPC detector 81 with 10.76 MHz reference carrier input signal.

The digital multiplexer 86 responds to the pilot carrier presence detector 21 not detecting pilot carrier accompanying the received DTV signal, which is indicative that the received DTV signal is a QAM signal, to select the output signal of a squaring circuit 8A for application to the bandpass filter 87 that provides a selective response centered at 5.38 MHz. A bandpass FIR digital filter 8B that provides a selective response centered at 2.69 MHz for selecting the 2.69 MHz first subharmonic of the symbol frequency of a baseband QAM signal supplies input signal to the squaring circuit 8A, which generates harmonics of the filter 8B response including a strong 5.38 MHz component. This baseband QAM signal can be supplied either from the QAM in-phase synchronous detector 40, as shown in FIG. 7, or from the QAM quadrature-phase synchronous detector 45. The squaring circuit 8A is shown in FIG. 7 as a digital multiplier receiving the filter 8B response both as multiplier and multiplicand. The squaring circuit 8A can be constructed from logic gates as a digital multiplier, but for the sake of speedier operation is better provided by a ROM storing a look-up table of squares. An absolute-value circuit can be used as a substitute for the squaring circuit in generating harmonics of the response of a preceding filter, but produces weaker second harmonics and so is not preferred.

FIG. 7 also shows a representative construction of a first address generator 60 that supplies addresses to a cosine look-up table portion 491 and a sine look-up table portion 492 of the ROM 49 that provides complex-number digital descriptions of two phasings of the QAM carrier, as translated to a final intermediate frequency and in quadrature relationship with each other. Transitions of the first clock signal are counted by a first address counter 61 in the first address generator 60 to generate a basic first address signal. This basic first address signal is applied as a first summand to a digital adder 62. A first address correction signal, which is applied to the adder 62 as a second summand, adds to the basic first address signal in the adder 62 for generating as a sum output signal a corrected first address signal for addressing both the cosine look-up table portion 491 and the sine look-up table portion 492 of the ROM 49. A symbol-clock-rotation detector 63 responds to the sequence of real samples of QAM signal as synchrodyned to baseband by the QAM in-phase synchronous detector 40 and to the sequence of imaginary samples of QAM signal as synchrodyned to baseband by the QAM quadrature-phase synchronous detector 45. The symbol-clock-rotation detector 63 detects the misphasing between symbol clocking done at the receiver in accordance with the first clock signal and symbol clocking done at the transmitter, as evidenced in the received QAM signal heterodyned to a final intermediate frequency that is a submultiple of its symbol frequency. Several types of symbol-clock-rotation detector 63 are described and background literature describing certain of them are catalogued in U.S. Pat. No. 5,115,454 issued May 19, 1992 to A. D. Kucar, entitled METHOD AND APPARATUS FOR CARRIER SYNCHRONIZATION AND DATA DETECTION, and incorporated herein by reference. A digital lowpass filter 64 averages over many samples (e.g., several million) the misphasing of the symbol clocking done at the receiver as detected by the symbol-clock-rotation detector 63 to generate the first address correction signal supplied to the adder 62 to correct the basic first address. Averaging over so many samples can be done by procedures which accumulate lesser numbers of samples and dump them forward at a reduced sample rate for further accumulation, accumulation and subsampling being repeated a few times with progressively lower subsampling rates.

FIG. 7 also shows a representative construction of a second address generator 70 that supplies addresses to a cosine look-up table portion 591 and a sine look-up table portion 592 of the ROM 59 that provides complex-number digital descriptions of two phasings of the VSB carrier, as translated to a final intermediate frequency and in quadrature relationship with each other. Transitions of the first clock signal are counted by a second address counter 71 in the second address generator 70 to generate a basic second address signal. This basic second address signal is applied as a first summand to a digital adder 72. A second address correction signal, which is applied to the adder 72 as a second summand, adds to the basic second address signal in the adder 72 for generating as a sum output signal a corrected second address signal for addressing both the cosine look-up table portion 591 and the sine look-up table portion 592 of the ROM 59.

FIG. 7 shows a clocked digital delay line 73 for delaying the samples from the in-phase synchronous detector 50 by a prescribed number of sample periods prior to their being applied as input signal to a quantizer 74, which supplies the quantization level most closely approximated by the sample currently received by the quantizer 74 as input signal. The quantization levels can be inferred from the energy of the pilot carrier accompanying the VSB signal or can be inferred from the result of envelope detection of the VSB signal. The closest quantization level selected by the quantizer 74 as its output signal has the corresponding quantizer 74 input signal subtracted therefrom by a digital adder/subtractor 75, which is operated as a clocked element by including a clocked latch at its output. The difference output signal from the adder/subtractor 75 describes the departure of the symbol levels actually recovered from those that should be recovered, but whether the polarity of the departure is attributable to symbol misphasing being leading or lagging remains to be resolved.

The samples from the in-phase synchronous detector 50 applied as input signal to the clocked digital delay line 73 are applied without delay as input signal to a mean-square-error gradient detection filter 76. The filter 76 is a finite-impulse-response (FIR) digital filter having a $(-\frac{1}{2}), 1, 0, (-1), (+\frac{1}{2})$ kernel, the operation of which is clocked by the first sampling clock. The prescribed number of sample periods of delay provided by the clocked digital delay line 73 is such that filter 76 response is in temporal alignment with the difference signal from the adder/subtractor 75. A digital multiplier 77 multiplies the difference signal from the adder/subtractor 75 with the filter 76 response to resolve this issue. The sign bit and the next most significant bit of the two's complement filter 76 response suffice for the multiplication, which permits simplification of the digital multiplier 77 structure. The samples of the product signal from the digital multiplier 77 are indications of the misphasing of the symbol clocking done at the receiver that are averaged over many samples (e.g., several million) by a digital lowpass filter 78 for generating the second address correction signal supplied to the adder 72 to correct the basic second address.

The symbol synchronization techniques used in the second address generator 70 shown FIG. 6 are of the same general type as S. U. H. Qureshi describes for use with pulse amplitude modulation (PAM) signals in his paper "Timing Recovery for Equalized Partial-Response Systems, IEEE Transactions on Communications, December 1976, pp. 1326–1330. These symbol synchronization techniques as used in connection with symbol synchronization for VSB signals are specifically described by C. B. Patel and the inventor in their earlier-filed applications referenced earlier in this specification. In preferred designs of the general type of second address generator 70 shown in FIG. 7, the clocked digital delay line 73 does not exist as a separate element; instead, an input signal to the quantizer 74 with the requisite number of sample periods of delay for the difference signal from the adder/subtractor 75 being temporally aligned with the filter 76 response is taken from the tapped digital delay line included in the filter 76 for supplying differentially delayed samples to be weighted by the $(-\frac{1}{2}), 1, 0, (-1), (+\frac{1}{2})$ kernel before being summed to generate the filter 76 response.

Figure 8:
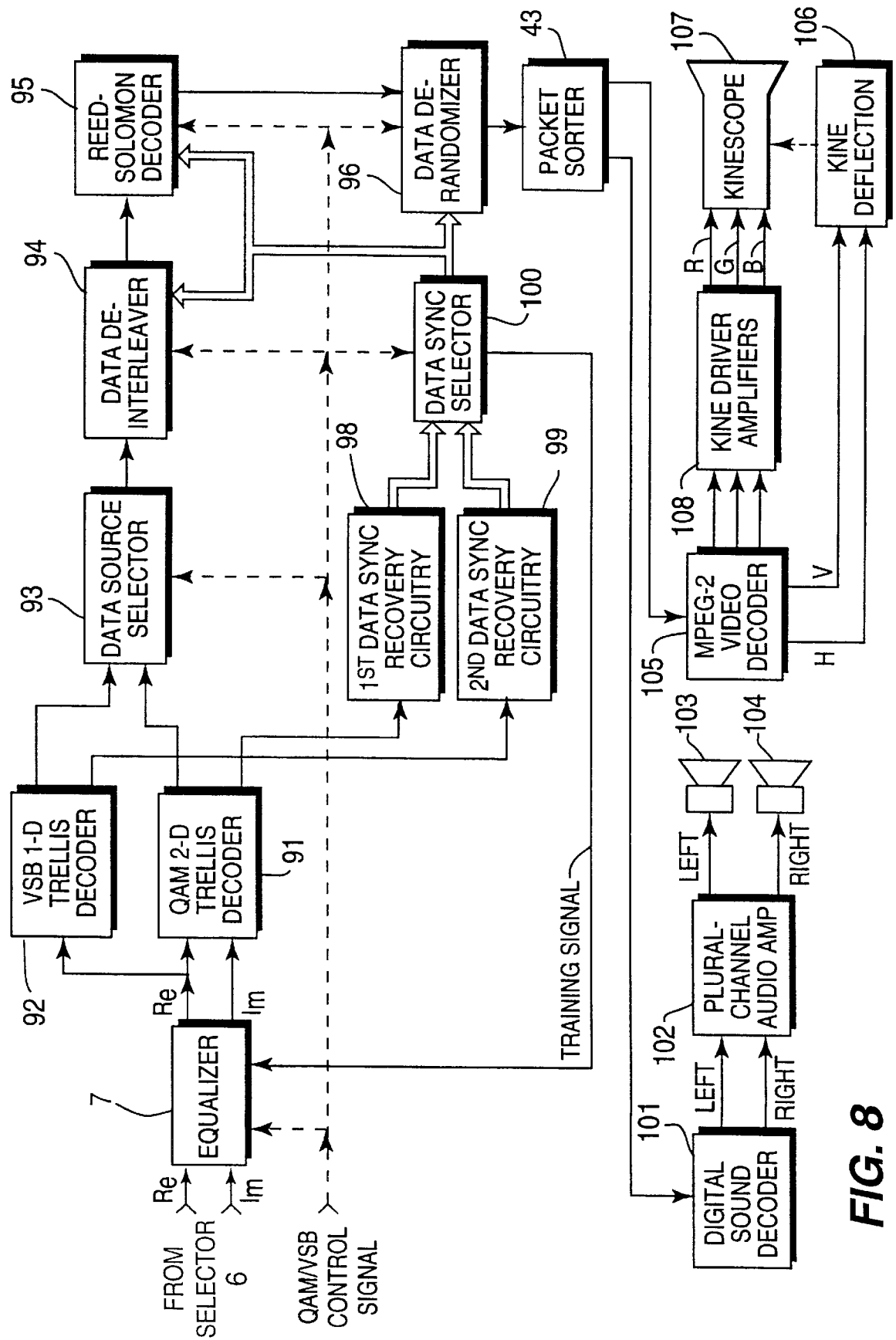
FIG. 8 is a block schematic diagram showing remaining portions of the DTV receivers radio receiver portions of which are shown in FIGS. 1, 2, 3 and 4.

FIG. 8 shows the amplitude-and-group-delay equalizer 7, which converts a baseband response with an amplitude-versus-frequency characteristic that tends to cause inter-symbol error to a more optimum amplitude-versus-frequency characteristic that minimizes the likelihood of inter-symbol error. The amplitude-and-group-delay equalizer 7, which is also shown in the FIGS. 1–4, can be a suitable one of the monolithic ICs available off-the-shelf for use in equalizers. Such an IC includes a multiple-tap digital filter used for amplitude-and-group-delay equalization, the tap weights of which filter are programmable; circuitry for selectively accumulating training signal and temporarily storing the accumulation results; and a microcomputer for comparing the temporarily stored accumulation results with an ideal training signal as known a priori and for calculating updated tap weights of the multiple-tap digital filter used for amplitude-and-group-delay equalization.

During VSB AM reception, the real response of the amplitude-and-group-delay equalizer 7 is applied as input signal to one-dimensional symbol decoding circuitry 91, which performs the symbol decoding that recovers symbol-decoded digital data streams from a VSB-origin signal. A VSB signal in accordance with the ATSC standard uses trellis coding of the data in all data segments except the initial data segment of each data field, which contains field synchronization code groups that are not subject to trellis coding. As in the prior art, one of the symbol-decoded digital data streams that the symbol decoding circuitry 91 supplies, which is to be employed for further data processing is generated by trellis-decoding the results of data-slicing procedures, and optimal Viterbi decoding techniques are customarily employed. As in the prior art, another of the symbol-decoded digital data streams that the symbol decoding circuitry 91 supplies, which is to be employed for controlling data handling by the receiver responsive to synchronization information contained in the received QAM-origin signal, is generated using data-slicing procedures without subsequent trellis decoding. The symbol decoding circuitry 91 preferably departs from usual prior-art practice by utilizing data-slicing techniques similar to those described by the inventor in U.S. Pat. No. 5,748,226 issued May 5, 1998, entitled DIGITAL TELEVISION RECEIVER WITH ADAPTIVE FILTER CIRCUITRY FOR SUPPRESSING NTSC CO-CHANNEL INTERFERENCE, and incorporated herein by reference.

During QAM reception both the real and the imaginary responses of the amplitude-and-group-delay equalizer 7 are applied as input signal to two-dimensional symbol decoding circuitry 92, which performs the symbol decoding that recovers symbol-decoded digital data streams from a QAM-origin signal. Presuming that the QAM-origin signal contains data synchronizing information corresponding with that in the VSB-origin signal, one of these symbol-decoded digital data streams is a trellis-decoded digital data stream supplied for further data processing, and another of these symbol-decoded digital data streams is generated by data-slicing without subsequent trellis decoding. This latter symbol-decoded digital data stream is employed for controlling data handling by the receiver responsive to synchronization information contained in the received VSB-origin signal.

A digital-signal multiplexer 93 functions as a data source selector that selects as its response either a first or a second one of two digital input signals thereto, the selection being controlled by the VSB pilot presence detector 21 for detecting the zero-frequency term of the real samples from the VSB synchrodyne circuitry 5. When the zero-frequency term has essentially zero energy, indicating the absence of pilot carrier signal that accompanies a VSB signal, the multiplexer 93 selectively responds to its first digital input signal, selecting as the source of its digital data output the two-dimensional symbol decoding circuitry 91 that decodes the symbols received in the QAM signal. When the zero-frequency term has substantial energy, indicating the presence of pilot carrier signal that accompanies a VSB signal, the multiplexer 93 selectively responds to its second digital input signal, selecting as the source of its digital data output the one-dimensional symbol decoding circuitry 92 that decodes the symbols received in the VSB signal.

The data selected by the data source selection multiplexer 93 are applied to a data de-interleaver 94 as its input signal, and the de-interleaved data supplied from the data de-interleaver 94 are applied to a Reed-Solomon decoder 95. The data de-interleaver 94 is often constructed within its own monolithic IC and is made so as to respond to the output indications from the VSB pilot carrier presence detector 21 to select the de-interleaving algorithm suitable to the DTV signal currently being received, whether it be of QAM or VSB type; this is a mere matter of design. The Reed-Solomon decoder 95 is often constructed within its own monolithic IC and is made so as to respond to the output indications from the VSB pilot carrier presence detector 21 to select the appropriate Reed-Solomon decoding algorithm for the DTV signal currently being received, whether it be of QAM or VSB type; this also is a mere matter of design.

Error-corrected data are supplied from the Reed-Solomon decoder 95 to a data de-randomizer 96, which responds to these data for regenerating a signal randomized prior to transmission to the DTV receiver, which regenerated signal comprises packets of data for a packet sorter 97. The data de-randomizer 96 is made so as to respond to the output indications from the VSB pilot carrier presence detector 21 to select the appropriate data de-randomizing algorithm for the DTV signal currently being received, whether it be of QAM or VSB type; the selection of these algorithms is a mere matter of design, too.

First data synchronization recovery circuitry 98 recovers the data synchronizing information included in the data output of the two-dimensional symbol decoding circuitry decoder 91, and second data synchronization recovery circuitry 99 recovers the data synchronizing information included in the data output of the one-dimensional symbol decoding circuitry 92. A data sync selector 100 selects between the data synchronizing information as provided by the data sync recovery circuitry 98 and as provided by the data sync recovery circuitry 99, the selection being controlled by the VSB pilot carrier presence detector 21 for detecting the zero-frequency term of the real samples from the VSB synchrodyne circuitry 5. When the zero-frequency term has essentially zero energy, indicating the absence of pilot carrier signal that accompanies a VSB signal, the data sync selector 100 selects for its output signals the data synchronizing information provided by the data sync recovery circuitry 98. When the zero-frequency term has substantial energy, indicating the presence of pilot carrier signal that accompanies a VSB signal, the data sync selector 100 selects for its output signals the data synchronizing information provided by the data sync recovery circuitry 99.

When the data sync selector 100 selects for its output signals the data synchronizing information provided by the data sync recovery circuitry 99, the initial data lines of each data field are selected for application to the amplitude-and-group-delay equalizer 7 as training signal. The occurrences of two consecutive 63-sample PR sequences are detected within the data sync recovery circuitry 99 to provide data-field indexing information to the data sync selector 100.

The standards for a QAM DTV signal are not as well defined at this time as the standards for a VSB DTV signal. A 32-state QAM signal provides sufficient capacity for a single HDTV signal, without having to resort to compression techniques outside MPEG standards, but commonly some compression techniques outside MPEG standards are employed to encode the single HDTV signal as a 16-state QAM signal. The occurence of a prescribed 24-bit word is detected by the data sync recovery circuitry 99 to generate data-field indexing information for application to the data sync selector 100. A multiplexer within the data sync selector 100 selects between the data-field indexing information respectively supplied by the data sync recovery circuitry 98 and the data sync recovery circuitry 99; the data-field indexing information thus selected is supplied to the data de-interleaver 94, the Reed-Solomon decoder 95, and the data de-randomizer 96. At the time this specification is written there is no training signal included in the QAM DTV signal. Accordingly, the amplitude-and-group-delay equalizer 7 is arranged to provide a flat amplitude-versus-frequency characteristic in response to the VSB pilot carrier presence detector 21 indicating the absence of pilot carrier, and the VSB training signal selected by the data sync recovery circuitry 99 is wired through the data sync selector 100 without need for a multiplexer. Also, there is no data line synchronization signal for QAM DTV transmission, at least not one selected as a standard. The data sync recovery circuitry 98 includes counting circuitry for counting the samples in each data field to generate intra-data-field synchronizing information. This intra-data-field synchronizing information and the intra-data-field synchronizing information (such as data line count) generated by the data sync recovery circuitry 99 are selected between by appropriate multiplexers in the data sync selector 100, for application to the data de-interleaver 94, the Reed-Solomon decoder 95, and the data de-randomizer 96, as required.

Data synchronization can alternatively be accomplished before symbol decoding, using match filters that generate spike responses to synchronization code sequences in the selector 6 response or in the equalizer 7 response. The filters that generate spike responses to synchronization code sequences are preferably supplied input signals with sampling rate reduced to the baud rate or symbol rate of ATSC signal, rather than their input signals being the over-sampled responses of synchrodyne circuits 4 and 5, in order to reduce the number of samples in the respective kernel of each match filter. The filters that generate spike responses to synchronization code sequences are preferably connected to receive the equalizer 7 response to reduce the effect that multi-path reception has on data synchronization.

The packet sorter 97 sorts packets of data for different applications, responsive to header codes in the successive packets of data. Packets of data descriptive of the audio portions of the DTV program are applied by the packet sorter 97 to a digital sound decoder 101. The digital sound decoder 101 supplies left-channel and right-channel stereophonic sound signals to a plural-channel audio amplifier 102 that drives the plurality of loudspeakers 103, 104. Packets of data descriptive of the video portions of the DTV program are applied by the packet sorter 97 to an MPEG decoder 105, such as of MPEG-2 type. The MPEG decoder 105 supplies horizontal (H) and vertical (V) synchronizing signals to kinescope deflection circuitry 106 that provides for the raster scanning of the viewing screen of a kinescope 107. The MPEG decoder 105 also supplies signals to the kinescope driver amplifiers 108 for applying amplified red (R), green (G) and blue (B) drive signals to the kinescope 107. In variations of the DTV receiver shown in any one of the FIGS. 1, 2, 3 and 4 and in FIG. 8, a different display device may be used instead of or in addition to the kinescope 107, and the sound recovery system may be different, consisting of but a single audio channel, or being more elaborate than a simple stereophonic reproduction system.

The real-to-complex-sample converters 48 and 58 can employ Hilbert transform generation filters and delay compensation circuitry as described by C. B. Patel and the inventor in their U.S. Pat. No. 5,479,449 issued Dec. 26, 1995, entitled DIGITAL VSB DETECTOR WITH BANDPASS PHASE TRACKER, AS FOR INCLUSION IN AN HDTV RECEIVER, and incorporated herein by reference. Alternatively, the real-to-complex-sample converters 48 and 58 can employ Rader filters as described by C. B. Patel and the inventor in their U.S. Pat. No. 5,548,617 issued Oct. 20, 1996, entitled DIGITAL VSB DETECTOR WITH BANDPASS PHASE TRACKER USING RADER FILTERS, AS FOR USE IN AN HDTV RECEIVER, and incorporated herein by reference. Or, the real-to-complex-sample converters 48 and 58 can employ Ng filters as described by C. B. Patel and the inventor in U.S. Pat. No. 5,731,848 issued Mar. 24, 1998, entitled DIGITAL VSB DETECTOR WITH BANDPASS PHASE TRACKER USING NG FILTERS, AS FOR USE IN AN HDTV RECEIVER, and incorporated herein by reference.

Preferably the lowest frequency of the final IF signal is above 1 MHz, to keep the ratio of the highest frequency of the final IF signal thereto substantially below 8:1 and thereby ease the filtering requirements for the real-to-complex-sample converters 48 and 58. To satisfy this preference in regard to the QAM signal alone, the lowest carrier frequency for the QAM carrier in the final IF signal is 3.69 MHz. To satisfy this preference in regard to the VSB signal alone, the lowest the carrier frequency for the VSB carrier in the final IF signal could be is 1.31 MHz, presuming its full sideband to be above its vestigial sideband in frequency, or 6.38 MHz, presuming its full sideband to be below its vestigial sideband in frequency.

As taught by C. B. Patel and the inventor in their U.S. Pat. No. 5,606,579 issued Feb. 25, 1997, entitled DIGITAL VSB DETECTOR WITH FINAL I-F CARRIER AT SUBMULTIPLE OF SYMBOL RATE, AS FOR USE IN AN HDTV RECEIVER, and incorporated herein by reference, there is a strong preference that the carrier of the signal being synchrodyned to baseband in the digital regime be at a submultiple of a multiple of the symbol rate. This makes practical the storage of digital carrier signals in read-only memory, rather than having to digitize analog carrier signals on a continuing basis.

If the sample rate in the ADC 19 is established by the first clock signal from the sample clock generator 8 to be the minimal $21.52*10^6$ samples per second required for proper demodulation of a QAM signal with $5.38*10^6$ symbols per second, preferably the final intermediate frequency to which the carrier of a QAM DTV signal is translated is not higher than 5.38 MHz, so that it can be sampled at least four times per cycle. If the QAM carrier of the final IF signal must lie between 3.69 MHz and 5.38 MHz, inclusive, the QAM carrier could be at the $7^{th}$, $8^{th}$, $9^{th}$ or $10^{th}$ subharmonic of 43.05 MHz, for example. The $7^{th}$ subharmonic of 43.05 MHz and $3^{rd}$ subharmonic of 21.52 MHz, 5.38 MHz, is a clear favorite for the final intermediate frequency to which the QAM carrier should be translated. It permits symmetries in the addressing of ROM 49 to be exploited to reduce the number of actual storage locations required. From the standpoint of keeping down the number of actual storage locations required in the ROM 49, the $11^{th}$ subharmonic of 43.05 MHz and $5^{th}$ subharmonic of 21.52 MHz, 3.587 MHz, might be a suitable final intermediate frequency to which the QAM carrier is translated, but the real-to-complex-sample converter 48 must then be designed to provide real-to-complex-sample conversion down to 900 kHz.

If the sample rate in the ADC 29 is established by the first clock signal from the sample clock generator 8 to be the minimal $21.52*10^6$ samples per second required for proper demodulation of a VSB signal with $10.76*10^6$ symbols per second, the final intermediate frequency to which the carrier of a VSB DTV signal is translated cannot be higher than 5.38 MHz, or the symbol synchronization techniques adapted from Qureshi's techniques cannot be successfully employed. If the full sideband of the VSB signal is to be below its vestigial sideband in frequency, the sample rate in the ADC 29 must be higher than $21.52*10^6$ samples per second (e.g., $43.05*10^6$ samples per second) in order that the carrier can be at least 6.38 MHz. To avoid the higher sample rate in the ADC 29, the full sideband of the VSB signal must be above its vestigial sideband in frequency. This means that the real-to-complex-sample converters 48 and 58 cannot practically employ Ng filters when the sample rate in the ADC 29 is $21.52*10^6$ samples per second.

The carrier of the VSB signal as translated to final intermediate frequency for synchrodyning to baseband must lie in the range between 1.31 MHz and 3.62 MHz, inclusive, if the final IF signal is to be constrained to a 1–9 MHz frequency range. The VSB carrier could be at the $5^{th}$, $6^{th}$, $7^{th}$, $8^{th}$, $9^{th}$, $10^{th}$, $11^{th}$, $12^{th}$, $13^{th}$, $14^{th}$ or $15^{th}$ subharmonic of 43.05 MHz, for example. The $15^{th}$ subharmonic, 2.690 MHz, appears to be a good choice for the final intermediate frequency to which the VSB carrier should be translated, viewed from the standpoint of reducing the size of carrier look-up tables in ROM by utilizing symmetries in addressing. However, 2.690 MHz is not the best choice if the QAM carrier in the final IF signal supplied to the synchrodyne circuitry 4 is 5.381 MHz, since the nominal frequencies of the third local oscillators 30 and 35 are then the same. Oscillators nearby each other that are of nearly the same frequencies have a tendency to oscillate in unison, which can adversely affect the ability to control separately their respective frequencies.

The $31^{st}$ subharmonic of 43.05 MHz, 1.345 MHz, which is the $15^{th}$ subharmonic of 21.52 MHz, appears to be another good choice for the final intermediate frequency to which the VSB carrier should be translated, from the standpoint of reducing the size of carrier look-up tables in ROM by utilizing symmetries in addressing. The $23^{rd}$ subharmonic of 43.05 MHz, 1.793 MHz, which is the $11^{th}$ subharmonic of 21.52 MHz, may be chosen instead, however, to ease the design requirements on the real-to-complex-sample converter 58 insofar as how low a frequency real-to-complex-sample conversion must be provided.

FIG. 9 is a table of design frequencies for the local oscillator used to supply the oscillations used to heterodyne a penultimate intermediate-frequency band centered at 44 MHz down to various final intermediate-frequency bands for QAM signals. The oscillations of the third local oscillator 30 are preferably below the penultimate IF band in order to lessen the possibility of the second harmonic of the oscillations interfering with any nearby frequency-modulation radio broadcast receiver.

FIG. 10 is a table of design frequencies for the local oscillator used to supply the oscillations used to heterodyne a penultimate intermediate-frequency band centered at 44 MHz down to various final intermediate-frequency bands for VSB signals, presuming the vestigial sideband to be located above the full sideband in frequency in both in the penultimate IF band and in the final IF band. This type of operation is associated with the ADCs 19 and 29 sampling at 43.05*10$^6$ samples per second, rather than at 21.52*10$^6$ samples per second, in which case a 4:1 rate reduction filter would be used if the equalizer 7 were to be a synchronous equalizer. The first local oscillator 10 provides oscillations above the first intermediate-frequency band to the mixer 11, so the vestigial sideband located below the full sideband in frequency in the received DTV channel is converted so as to be located above the full sideband in frequency in the first intermediate-frequency band. In order for the vestigial sideband to be located above the full sideband in frequency in the second or penultimate IF band, the second local oscillator 20 must supply the second mixer 14 oscillations at a frequency above the first intermediate-frequency band. In order for the vestigial sideband to be located above the full sideband in frequency in the second or penultimate IF band, the second local oscillator 20 must supply the second mixer 14 oscillations at a frequency below the first intermediate-frequency band. If the first IF band is centered at 940 MHz, for example, the second local oscillator 20 supplies oscillations at 896 MHz to center the penultimate IF band at 44 MHz. 896 MHz is above current UHF channel 83, so a nearby NTSC receiver will not tune these second oscillations if they radiate beyond the DTV receiver. If the vestigial sideband is located above the full sideband in frequency in the second or penultimate IF band, the third local oscillator 35 must supply the third mixer 28 with oscillations at a frequency below those in that penultimate IF band, in order that the vestigial sideband be located above the full sideband in frequency in the final IF band.

FIG. 11 is a table of design frequencies for the local oscillator used to supply the oscillations used to heterodyne a penultimate intermediate-frequency band centered at 44 MHz down to various final intermediate-frequency bands for VSB signals, presuming the vestigial sideband to be located below the full sideband in frequency both in the penultimate IF band and in the final IF band. The first local oscillator 10 provides oscillations above the first intermediate-frequency band to the mixer 11, so the vestigial sideband located below the full sideband in frequency in the received DTV channel is converted so as to be located above the full sideband in frequency in the first intermediate-frequency band. In order for the vestigial sideband to be located below the full sideband in frequency in the second or penultimate IF band, the second local oscillator 20 must supply the second mixer 14 oscillations at a frequency above the first intermediate-frequency band. If the first IF band is centered at 916 MHz, for example, the second local oscillator 20 supplies oscillations at 960 MHz to center the penultimate IF band at 44 MHz. It is desirable that the second local oscillator 20 supplies oscillations at no higher a frequency than 960 MHz, in order to minimize the possibility of interference with the aeronautical navigation band. If the vestigial sideband is located below the full sideband in frequency in the second or penultimate IF band, the third local oscillator 35 must supply the third mixer 28 with oscillations at a frequency below those in that penultimate IF band, in order that the vestigial sideband be located below the full sideband in frequency in the final IF band.

Locating the second or penultimate IF band lower in frequency facilitates the third local oscillator 35 oscillating at a frequency above this IF band. Such arrangement permits the vestigial sideband to be located above the full sideband in frequency in the penultimate IF band and the vestigial sideband to be located below the full sideband in frequency in the final IF band. Such arrangement alternatively permits the vestigial sideband to be located below the full sideband in frequency in the penultimate IF band and the vestigial sideband to be located above the full sideband in frequency in the final IF band. The oscillating frequency of the second local oscillator 20 need not be as much removed from the first intermediate-frequency band, which eases design requirements in the UHF portions of the radio receiver portions of the DTV signal receiver. The penultimate IF band being at a lower frequency makes satisfactory design of the SAW filter 16 more difficult, however.

In the foregoing specification the ordinal numbers used as adjectives before the terms "mixer" and "local oscillator" are in accordance with normal engineering parlance descriptive of their placement in the radio receiver. This parlance is not carried over into the claims which follow, except as these ordinal numbers may appear in quotation marks. Ordinal numbers not in quotation marks in the claims merely refer to the consecutive order in which the elements referred to by such ordinal numbers first appear in a set of claims.

What is claimed is:

1. A radio receiver for receiving a selected digital television signal, irrespective of whether it is a quadrature-amplitude-modulation (QAM) or a vestigial-sideband (VSB) digital television signal, said radio receiver comprising:

front-end circuitry for selecting said selected digital television signal and converting it with amplification to at least a first amplified penultimate intermediate-frequency signal;

a first frequency converter for converting to a first final intermediate-frequency signal said first amplified penultimate intermediate-frequency signal, said first frequency converter including
  a first controlled oscillator the frequency and phase of its oscillations controlled by a first automatic-frequency-and-phase-control signal;
  a first analog-to-digital converter for digitizing said first final intermediate-frequency signal to generate a digitized first final intermediate-frequency signal;
  circuitry for synchrodyning any QAM digital television signal in said digitized first final intermediate-frequency signal to baseband, thus to generate a first in-phase baseband signal and a first quadrature-phase baseband signal;
  circuitry for synchrodyning any VSB digital television signal in a digitized second final intermediate-frequency signal to baseband, thus to generate a second in-phase baseband signal and a second quadrature-phase baseband signal;

first automatic-frequency-and-phase-control circuitry for generating said first automatic-frequency-and-phase-control signal responsive to said first in-phase baseband signal and said first quadrature-phase baseband signal, said first automatic-frequency-and-phase-control signal being responsive neither to said second in-phase baseband signal nor to said second quadrature-phase baseband signal;

a second frequency converter for converting to a second final intermediate-frequency signal a second amplified penultimate intermediate-frequency signal supplied from said front-end circuitry, said second frequency converter including
  a second controlled oscillator the frequency and phase of its oscillations controlled by a second automatic-frequency-and-phase-control signal;
  a second analog-to-digital converter for digitizing said second final intermediate-frequency signal to generate a digitized second final intermediate-frequency signal;
  second automatic-frequency-and-phase-control circuitry for generating said second automatic-frequency-and-phase-control signal responsive to said second quadrature-phase baseband signal, said second automatic-frequency-and-phase-control signal being responsive neither to said first in-phase baseband signal nor to said first quadrature-phase baseband signal.

2. A radio receiver as set forth in claim 1, wherein said front-end circuitry comprises:
  first and second intermediate-frequency amplifiers with controlled respective gains, for supplying said first and second amplified penultimate intermediate-frequency signals as respective responses thereof to a shared penultimate intermediate-frequency input signal.

3. A radio receiver as set forth in claim 2, wherein said front-end circuitry further comprises:
  double-conversion receiver circuitry for supplying said shared penultimate intermediate-frequency input signal in response to said selected digital television signal.

4. A radio receiver as set forth in claim 3, wherein said double-conversion receiver circuitry includes:
  a radio-frequency amplifier with controlled gain.

5. A radio receiver as set forth in claim 4, further comprising:
  a QAM automatic-gain-control detector responsive to said first in-phase baseband signal and said first quadrature-phase baseband signal for supplying a first automatic-gain-control signal;
  a VSB automatic-gain-control detector responsive to said second in-phase baseband signal for supplying a second automatic-gain-control signal;
  an automatic-gain-control signal combiner for combining said first and second automatic-gain-control signals to generate a third automatic-gain-control signal applied to said first and second intermediate-frequency amplifiers; and
  an automatic-gain-control delay circuit responsive to said third automatic-gain-control signal over a portion of the range thereof to generate a fourth automatic-gain-control signal applied to said radio-frequency amplifier.

6. A radio receiver as set forth in claim 2, further comprising:
  a QAM automatic-gain-control detector responsive to said first in-phase baseband signal and said first quadrature-phase baseband signal for supplying a first automatic-gain-control signal;
  a VSB automatic-gain-control detector responsive to said second in-phase baseband signal for supplying a second automatic-gain-control signal; and
  an automatic-gain-control signal combiner for combining said first and second automatic-gain-control signals to generate a third automatic-gain-control signal applied to said first and second intermediate-frequency amplifiers.

7. A radio receiver as set forth in claim 1, wherein said front-end circuitry comprises:
  an intermediate-frequency amplifier with controlled gain, for supplying said first and second amplified penultimate intermediate-frequency signals as response thereof to a penultimate intermediate-frequency input signal.

8. A radio receiver as set forth in claim 7, wherein said front-end circuitry further comprises:
  double-conversion receiver circuitry for supplying said intermediate-frequency amplifier with said penultimate intermediate-frequency input signal in response to said selected digital television signal.

9. A radio receiver as set forth in claim 8, wherein said double-conversion receiver circuitry includes:
  a radio-frequency amplifier with controlled gain.

10. A radio receiver as set forth in claim 9, further comprising:
  a QAM automatic-gain-control detector responsive to said first in-phase baseband signal and said first quadrature-phase baseband signal for supplying a first automatic-gain-control signal;
  a VSB automatic-gain-control detector responsive to said second in-phase baseband signal for supplying a second automatic-gain-control signal;
  an automatic-gain-control signal combiner for combining said first and second automatic-gain-control signals to generate a third automatic-gain-control signal applied to said intermediate-frequency amplifier; and
  an automatic-gain-control delay circuit responsive to said third automatic-gain-control signal over a portion of the range thereof to generate a fourth automatic-gain-control signal applied to said radio-frequency amplifier.

11. A radio receiver as set forth in claim 7, further comprising:
- a QAM automatic-gain-control detector responsive to said first in-phase baseband signal and said first quadrature-phase baseband signal for supplying a first automatic-gain-control signal;
- a VSB automatic-gain-control detector responsive to said second in-phase baseband signal for supplying a second automatic-gain-control signal; and
- an automatic-gain-control signal combiner for combining said first and second automatic-gain-control signals to generate a third automatic-gain-control signal applied to said intermediate-frequency amplifier.

12. A radio receiver for receiving a selected digital television signal, irrespective of whether it is a quadrature-amplitude-modulation (QAM) or a vestigial-sideband (VSB) digital television signal, said radio receiver comprising:
- front-end circuitry for selecting said selected digital television signal and converting it with amplification to first and second amplified penultimate intermediate-frequency signals;
- a first controlled oscillator supplying first oscillations of frequency and phase controlled by a first automatic-frequency-and-phase-control signal;
- a second controlled oscillator supplying second oscillations of frequency and phase controlled by a second automatic-frequency-and-phase-control signal;
- a first mixer supplying a first final intermediate frequency signal responsive to said first amplified penultimate intermediate-frequency signal as heterodyned with said first oscillations;
- a second mixer supplying a second final intermediate frequency signal responsive to said second amplified penultimate intermediate-frequency signal as heterodyned with said second oscillations;
- a first analog-to-digital converter for digitizing said first final intermediate frequency signal;
- a second analog-to-digital converter for digitizing said second final intermediate frequency signal;
- circuitry for synchrodyning any QAM digital television signal in the digitized first final intermediate-frequency signal to baseband, thus to generate a first in-phase baseband signal and a first quadrature-phase baseband signal;
- first automatic-frequency-and-phase-control circuitry for generating said first automatic-frequency-and-phase-control signal responsive to said first in-phase baseband signal and said first quadrature-phase baseband signal;
- circuitry for synchrodyning any VSB digital television signal in the digitized second final intermediate-frequency signal to baseband, thus to generate a second in-phase baseband signal and a second quadrature-phase baseband signal
- second automatic-frequency-and-phase-control circuitry for generating said second automatic-frequency-and-phase-control signal responsive to said second quadrature-phase baseband signal; and
- a synchrodyne result selector for selecting either said first in-phase baseband signal and said first quadrature-phase baseband signal for further processing or for selecting said second in-phase baseband signal for further processing.

13. A radio receiver as set forth in claim 12, further comprising:
- a VSB pilot presence detector for detecting the presence of substantial direct component in said second in-phase baseband signal to condition said synchrodyne result selector to select said second in-phase baseband signal for further processing.

14. A radio receiver as set forth in claim 13, wherein said front-end circuitry comprises:
- first and second intermediate-frequency amplifiers with controlled respective gains, for supplying said first and second amplified penultimate intermediate-frequency signals as respective responses thereof to a shared penultimate intermediate-frequency input signal.

15. A radio receiver as set forth in claim 14, wherein said front-end circuitry further comprises:
- double-conversion receiver circuitry for supplying said shared penultimate intermediate-frequency input signal in response to said selected digital television signal.

16. A radio receiver as set forth in claim 15, wherein said double-conversion receiver circuitry includes:
- a radio-frequency amplifier with controlled gain.

17. A radio receiver as set forth in claim 16, further comprising:
- a QAM automatic-gain-control detector responsive to said first in-phase baseband signal and said first quadrature-phase baseband signal for supplying a first automatic-gain-control signal;
- a VSB automatic-gain-control detector responsive to said second in-phase baseband signal for supplying a second automatic-gain-control signal;
- an automatic-gain-control signal combiner for combining said first and second automatic-gain-control signals to generate a third automatic-gain-control signal applied to said first and second intermediate-frequency amplifiers; and
- an automatic-gain-control delay circuit responsive to said third automatic-gain-control signal over a portion of the range thereof to generate a fourth automatic-gain-control signal applied to said radio-frequency amplifier.

18. A radio receiver as set forth in claim 14, further comprising:
- a QAM automatic-gain-control detector responsive to said first in-phase baseband signal and said first quadrature-phase baseband signal for supplying a first automatic-gain-control signal;
- a VSB automatic-gain-control detector responsive to said second in-phase baseband signal for supplying a second automatic-gain-control signal; and
- an automatic-gain-control signal combiner for combining said first and second automatic-gain-control signals to generate a third automatic-gain-control signal applied to said first and second intermediate-frequency amplifiers.

19. A radio receiver as set forth in claim 13, wherein said front-end circuitry comprises:
- an intermediate-frequency amplifier with controlled gain, for supplying said first and second amplified penultimate intermediate-frequency signals as response thereof to a penultimate intermediate-frequency input signal.

20. A radio receiver as set forth in claim 19, wherein said front-end circuitry further comprises:
- double-conversion receiver circuitry for supplying said intermediate-frequency amplifier with said penultimate intermediate-frequency input signal in response to said selected digital television signal.

21. A radio receiver as set forth in claim 20, wherein said double-conversion receiver circuitry includes:
- a radio-frequency amplifier with controlled gain.

22. A radio receiver as set forth in claim 21, further comprising:
- a QAM automatic-gain-control detector responsive to said first in-phase baseband signal and said first quadrature-phase baseband signal for supplying a first automatic-gain-control signal;

a VSB automatic-gain-control detector responsive to said second in-phase baseband signal for supplying a second automatic-gain-control signal;

an automatic-gain-control signal combiner for combining said first and second automatic-gain-control signals to generate a third automatic-gain-control signal applied to said intermediate-frequency amplifier; and an automatic-gain-control delay circuit responsive to said third automatic-gain-control signal over a portion of the range thereof to generate a fourth automatic-gain-control signal applied to said radio-frequency amplifier.

23. A radio receiver as set forth in claim 19, further comprising:

a QAM automatic-gain-control detector responsive to said first in-phase baseband signal and said first quadrature-phase baseband signal for supplying a first automatic-gain-control signal;

a VSB automatic-gain-control detector responsive to said second in-phase baseband signal for supplying a second automatic-gain-control signal; and an automatic-gain-control signal combiner for combining said first and second automatic-gain-control signals to generate a third automatic-gain-control signal applied to said intermediate-frequency amplifier.

24. A radio receiver as set forth in claim 12, further comprising:

an imaginary sample presence detector for detecting the presence of imaginary samples in said second in-phase baseband signal to condition said synchrodyne result selector to select said first quadrature-phase baseband signal and said first quadrature-phase baseband signal for further processing.

25. A radio receiver as set forth in claim 24, wherein said front-end circuitry comprises:

first and second intermediate-frequency amplifiers with controlled respective gains, for supplying said first and second amplified penultimate intermediate-frequency signals as respective responses thereof to a shared penultimate intermediate-frequency input signal.

26. A radio receiver as set forth in claim 25, wherein said front-end circuitry further comprises:

double-conversion receiver circuitry for supplying said shared penultimate intermediate-frequency input signal in response to said selected digital television signal.

27. A radio receiver as set forth in claim 26, wherein said double-conversion receiver circuitry includes:

a radio-frequency amplifier with controlled gain.

28. A radio receiver as set forth in claim 27, further comprising:

a QAM automatic-gain-control detector responsive to said first in-phase baseband signal and said first quadrature-phase baseband signal for supplying a first automatic-gain-control signal;

a VSB automatic-gain-control detector responsive to said second in-phase baseband signal for supplying a second automatic-gain-control signal;

an automatic-gain-control signal combiner for combining said first and second automatic-gain-control signals to generate a third automatic-gain-control signal applied to said first and second intermediate-frequency amplifiers; and an automatic-gain-control delay circuit responsive to said third automatic-gain-control signal over a portion of the range thereof to generate a fourth automatic-gain-control signal applied to said radio-frequency amplifier.

29. A radio receiver as set forth in claim 25, further comprising:

a QAM automatic-gain-control detector responsive to said first in-phase baseband signal and said first quadrature-phase baseband signal for supplying a first automatic-gain-control signal;

a VSB automatic-gain-control detector responsive to said second in-phase baseband signal for supplying a second automatic-gain-control signal; and an automatic-gain-control signal combiner for combining said first and second automatic-gain-control signals to generate a third automatic-gain-control signal applied to said first and second intermediate-frequency amplifiers.

30. A radio receiver as set forth in claim 24, wherein said front-end circuitry comprises:

an intermediate-frequency amplifier with controlled gain, for supplying said first and second amplified penultimate intermediate-frequency signals as response thereof to a penultimate intermediate-frequency input signal.

31. A radio receiver as set forth in claim 30, wherein said front-end circuitry further comprises:

double-conversion receiver circuitry for supplying said intermediate-frequency amplifier with said penultimate intermediate-frequency input signal in response to said selected digital television signal.

32. A radio receiver as set forth in claim 31, wherein said double-conversion receiver circuitry includes:

a radio-frequency amplifier with controlled gain.

33. A radio receiver as set forth in claim 32, further comprising:

a QAM automatic-gain-control detector responsive to said first in-phase baseband signal and said first quadrature-phase baseband signal for supplying a first automatic-gain-control signal;

a VSB automatic-gain-control detector responsive to said second in-phase baseband signal for supplying a second automatic-gain-control signal;

an automatic-gain-control signal combiner for combining said first and second automatic-gain-control signals to generate a third automatic-gain-control signal applied to said intermediate-frequency amplifier; and an automatic-gain-control delay circuit responsive to said third automatic-gain-control signal over a portion of the range thereof to generate a fourth automatic-gain-control signal applied to said radio-frequency amplifier.

34. A radio receiver as set forth in claim 30, further comprising:

a QAM automatic-gain-control detector responsive to said first in-phase baseband signal and said first quadrature-phase baseband signal for supplying a first automatic-gain-control signal;

a VSB automatic-gain-control detector responsive to said second in-phase baseband signal for supplying a second automatic-gain-control signal; and an automatic-gain-control signal combiner for combining said first and second automatic-gain-control signals to generate a third automatic-gain-control signal applied to said intermediate-frequency amplifier.

* * * * *